(12) United States Patent
Agata et al.

(10) Patent No.: US 9,523,007 B2
(45) Date of Patent: Dec. 20, 2016

(54) POLYMER COMPOSITION AND POLYMER LIGHT EMITTING DEVICE

(71) Applicant: SUMITOMO CHEMICAL COMPANY, LIMITED, Tokyo (JP)

(72) Inventors: Katsumi Agata, Ichikawa-shi (JP); Takeshi Yamada, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 15 days.

(21) Appl. No.: 14/323,100

(22) Filed: Jul. 3, 2014

(65) Prior Publication Data

US 2014/0316052 A1 Oct. 23, 2014

Related U.S. Application Data

(63) Continuation of application No. 11/915,157, filed as application No. PCT/JP2006/311363 on May 31, 2006, now Pat. No. 8,802,245.

(30) Foreign Application Priority Data

Jun. 1, 2005 (JP) ................. 2005-161036

(51) Int. Cl.
| | | |
|---|---|---|
| H01L 51/54 | (2006.01) | |
| C09K 11/06 | (2006.01) | |
| C09D 11/00 | (2014.01) | |
| C08G 61/02 | (2006.01) | |
| C08G 61/12 | (2006.01) | |
| C08G 73/02 | (2006.01) | |
| C08L 101/12 | (2006.01) | |
| H01L 51/00 | (2006.01) | |
| H05B 33/14 | (2006.01) | |
| H05B 33/22 | (2006.01) | |
| H01L 51/50 | (2006.01) | |

(52) U.S. Cl.
CPC ............ *C09D 11/00* (2013.01); *C08G 61/02* (2013.01); *C08G 61/123* (2013.01); *C08G 61/125* (2013.01); *C08G 61/126* (2013.01); *C08G 73/026* (2013.01); *C08L 101/12* (2013.01); *C09K 11/06* (2013.01); *H01L 51/0035* (2013.01); *H01L 51/0043* (2013.01); *H05B 33/14* (2013.01); *H05B 33/22* (2013.01); *C09K 2211/145* (2013.01); *C09K 2211/1416* (2013.01); *C09K 2211/1433* (2013.01); *C09K 2211/1458* (2013.01); *H01L 51/0036* (2013.01); *H01L 51/0039* (2013.01); *H01L 51/5012* (2013.01)

(58) Field of Classification Search
None
See application file for complete search history.

(56) References Cited

U.S. PATENT DOCUMENTS

| 6,353,083 | B1 * | 3/2002 | Inbasekaran ........... C08G 61/02 528/295 |
|---|---|---|---|
| 2001/0026878 | A1 | 10/2001 | Woo et al. |
| 2002/0177687 | A1 | 11/2002 | Noguchi et al. |
| 2003/0143429 | A1 | 7/2003 | Suzuki et al. |
| 2003/0165713 | A1 | 9/2003 | Oguma et al. |

FOREIGN PATENT DOCUMENTS

| JP | 2002-536492 A | 10/2002 |
|---|---|---|
| JP | 2002-338665 A | 11/2002 |
| JP | 2003-206335 A | 7/2003 |
| JP | 2004-2654 A | 1/2004 |
| JP | 2005-008723 A | 1/2005 |
| JP | 2005-232449 A | 9/2005 |
| WO | 00/46321 | 8/2000 |

OTHER PUBLICATIONS

Notification of Reason for Rejection, dated Oct. 25, 2011, issued in counterpart Japanese Application No. JP 2006-151275.
International Search Report mailed Jul. 18, 2006 in International Patent Application No. PCT/JP2006/311363.

* cited by examiner

*Primary Examiner* — Andrew K Boharty
(74) *Attorney, Agent, or Firm* — Sughrue Mion, PLLC

(57) ABSTRACT

A polymer composition comprising 1 to 99 wt % of a copolymer (A) and 99 to 1 wt % of a copolymer (B); the polymer composition used as a light emitting material of a light emitting device having high performances; Copolymers (A) and (B) being copolymers showing fluorescence in the solid state and having a polystyrene-reduced number average molecular weight of $10^3$ to $10^8$, and containing a repeating unit (a) and a repeating unit (b); Copolymer (A) has a relation of $100 > X_{aA} > 5$, where $X_{aA}$ (%) is a percentage of the mol number of repeating unit (a) based on the sum of the mol numbers of repeating units (a), and Copolymer (B) satisfies a relation of $X_{aB} \leq X_{aA} - 5$, where $X_{aB}$ (%) is a percentage of the mol number of repeating unit (a) based on the sum of the mol numbers of repeating units (a) and (b).

9 Claims, No Drawings

POLYMER COMPOSITION AND POLYMER LIGHT EMITTING DEVICE

CROSS REFERENCE TO RELATED APPLICATIONS

This application is a continuation of pending U.S. patent application Ser. No. 11/915,157, filed Nov. 21, 2007, now allowed, which is a 371 of PCT/JP2006/311363, filed May 31, 2006, and which claims priority to Japanese Patent Application No. 2005-161036, filed Jun. 1, 2005, the contents of all of which are incorporated herein by reference.

TECHNICAL FIELD

The present invention relates to a polymer composition and a polymer light emitting device (hereinafter, referred to as polymer LED in some cases).

BACKGROUND ART

As light emitting materials of high molecular weight to be used in light emitting devices, copolymers are investigated, and for example, there is disclosed a copolymer containing a repeating unit, N,N-diphenyl-N-diyl-amino group or tetraphenylphenylenediaminediyl group and a repeating unit, fluorene-diyl group (Japanese Patent Application Laid-Open (JP-A) No. 2002-338665).

However, there is a problem that when the above-described known copolymer is used as a light emitting material of a light emitting device, the performances of the light emitting device are not necessarily sufficient.

DISCLOSURE OF THE INVENTION

An object of the present invention is to provide a polymer composition which gives a light emitting device having high performances such as high light emission efficiency when used as a light emitting material of a light emitting device, longer life and the like.

That is, the present invention provides a polymer composition comprising 1 to 99 wt % of the following copolymer (A) and 99 to 1 wt % of the following copolymer (B).

Copolymer (A): a copolymer showing fluorescence in the solid state and having a polystyrene-reduced number average molecular weight of $10^3$ to $10^8$, and containing a repeating unit (a) and a repeating unit (b), and said copolymer has a relation of $100 > X_{aA} > 5$, provided that $X_{aA}$ (%) is a percentage of the mol number of the repeating unit (a) based on the sum of the mol numbers of the repeating units (a) and (b), Copolymer (B): a copolymer showing fluorescence in the solid state and having a polystyrene-reduced number average molecular weight of $10^3$ to $10^8$, and containing a repeating unit (a) and a repeating unit (b), and said copolymer satisfies a relation of $X_{aB} \leq X_{aA} - 5$, provided that $X_{aB}$ (%) is a percentage of the mol number of the repeating unit (a) based on the sum of the mol numbers of the repeating units (a) and (b).

BEST MODES FOR CARRYING OUT THE INVENTION

The polymer composition of the present invention contains the above-described copolymers (A) and (B). Both the copolymer (A) and the copolymer (B) contain a repeating unit (a) and a repeating unit (b).

The repeating unit (a) in the copolymer constituting the polymer composition of the present invention is preferably a repeating unit having a hole injection property or hole transportation property.

Here, as the repeating unit having a hole injection property or hole transportation property, di-valent groups are mentioned derived from low molecular weight compounds as hole transporting materials, and examples thereof include di-valent groups obtained by removing two hydrogen atoms from carbazole or derivatives thereof, silane or derivatives thereof, siloxane derivatives having an aromatic amine on the side chain or main chain, pyrazoline derivatives, arylamine derivatives, stilbene derivatives, triphenyldiamine derivatives, aniline or derivatives thereof, thiophene or derivatives thereof, pyrrole or derivatives thereof, p-phenylenevinylene or derivatives thereof, and 2,5-thienylenevinylene or derivatives thereof.

Of them, as the repeating unit (a), preferable are di-valent groups having an arylamine structure (di-valent groups obtained by removing hydrogen atoms from arylamine derivatives), and particularly preferable are repeating units represented by the following formula (1):

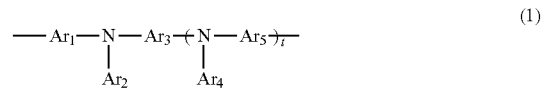

(here, $Ar_1$, $Ar_3$ and $Ar_5$ represent each independently an arylene group or a di-valent heterocyclic group. $Ar_2$ and $Ar_4$ represent each independently an aryl group or a mono-valent heterocyclic group. t represent an integer of 0 to 3. When there are a plurality of $Ar_4$s and $Ar_5$s, respectively, they may be the same or different.).

The aryl group in the formula (1) include a phenyl group, naphthyl group, anthracenyl group, condensed ring compound groups and the like.

As the phenyl group, the following structure is mentioned.

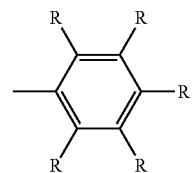

As the naphthyl group, the following structures are mentioned.

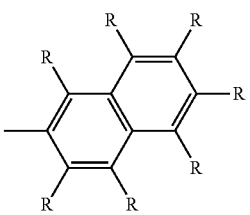 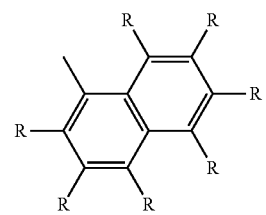

As the anthracenyl group, the following structures are mentioned.

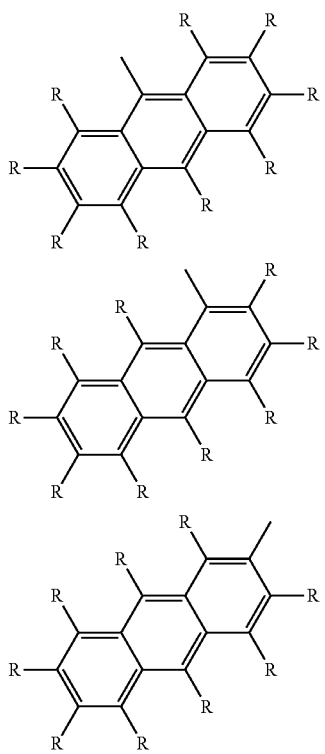

As the condensed ring compound group, the following structures are mentioned.

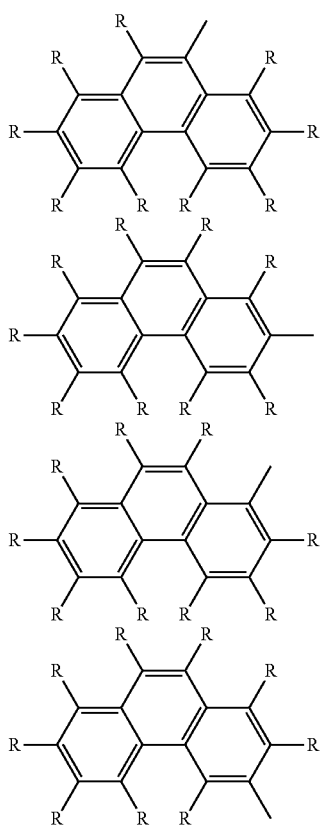

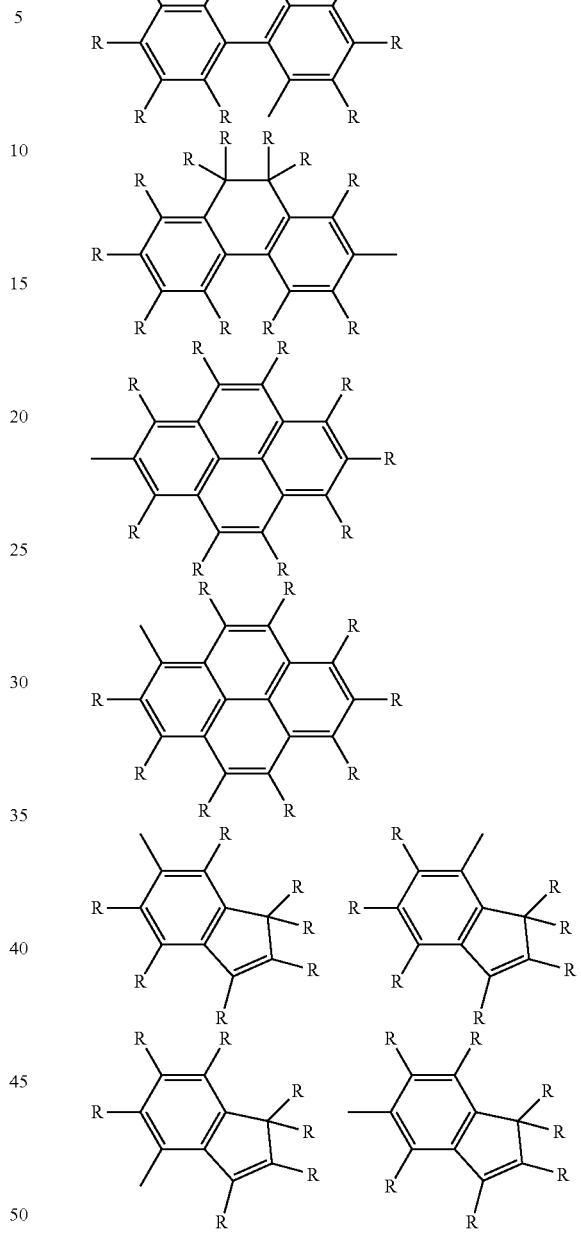

Here, R includes a hydrogen atom, alkyl group, alkoxy group, alkylthio group, alkylsilyl group, alkylamino group, hydroxyl group, amino group, carboxyl group, aldehyde group, cyano group and the like.

In the above-described formulas, a plurality of Rs are contained in one group, and these may be same or different.

Here, the alkyl group may be any of linear, branched or cyclic, and has a carbon number of usually about 1 to 20, and as specific examples thereof, a methyl group, ethyl group, propyl group, i-propyl group, butyl group, s-butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group and the like are mentioned.

The alkoxy group may be any of linear, branched or cyclic, and has a carbon number of usually about 1 to 20, and as specific examples thereof, a methoxy group, ethoxy group, propyloxy group, i-propyloxy group, butoxy group, i-butoxy group, t-butoxy group, pentyloxy group, isoamyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group and the like are mentioned.

The alkylthio group may be any of linear, branched or cyclic, and has a carbon number of usually about 1 to 20, and as specific examples thereof, a methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group and the like are mentioned.

The alkylsilyl group may be any of linear, branched or cyclic, and has a carbon number of usually about 1 to 60, and as specific examples thereof, a methylsilyl group, ethylsilyl group, propylsilyl group, i-propylsilyl group, butylsilyl group, i-butylsilyl group, t-butylsilyl group, pentylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group, laurylsilyl group, trimethylsilyl group, ethyldimethylsilyl group, propyldimethylsilyl group, i-propyldimethylsilyl group, butyldimethylsilyl group, t-butyldimethylsilyl group, pentyldimethylsilyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group and the like are mentioned.

The alkylamino group may be any of linear, branched or cyclic and may be a monoalkylamino group or dialkylamino group, and has a carbon number of usually about 1 to 40, and as specific examples thereof, a methylamino group, dimethylamino group, ethylamino group, diethylamino group, propylamino group, i-propylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group and the like are mentioned.

Of them, an alkyl group, alkoxy group, hydroxyl group, amino group, carboxyl group and aldehyde group are preferable, an n-alkyl group, i-alkyl group, s-alkyl group, alkoxy group, hydroxyl group, amino group carboxyl group and aldehyde group are more preferable, and an n-alkyl group, i-alkyl group, s-alkyl group and alkoxy group are further preferable.

In the formula (1), the mono-valent heterocyclic group means an atomic group in which one hydrogen atom is removed from a heterocyclic compound, and the number of carbon atom is usually about 4 to 60, preferably 4 to 20. The number of carbon atom of the mono-valent heterocyclic group does not include the number of carbon atom of a substituent.

Here, the heterocyclic compound refers to an organic compound having a cyclic structure in which elements constituting the ring include not only a carbon atom, but also a hetero atom such as oxygen, sulfur, nitrogen, phosphorus, boron and the like contained in the ring.

The mono-valent heterocyclic group includes mono-valent heterocyclic groups containing nitrogen as a hetero atom, groups containing silicon, nitrogen, oxygen, sulfur, selenium and the like as a hetero atom and having a fluorene structure, 5-membered heterocyclic groups containing sulfur, oxygen, nitrogen, silicon, selenium and the like as a hetero atom, condensed heterocyclic groups having a 5-membered ring or 6-membered ring heterocycle containing nitrogen, oxygen, sulfur, silicon, selenium and the like as a hetero atom;

5-membered ring heterocyclic groups containing silicon, nitrogen, sulfur, selenium and the like as a hetero atom, the heterocyclic groups being connected at α-position of the hetero atom to form a dimer or oligomer;

5-membered ring heterocyclic groups containing silicon, nitrogen, oxygen, sulfur, selenium and the like as a hetero atom, the heterocyclic groups being connected at α-position of the hetero atom to a phenyl group; and the like.

Examples of the mono-valent heterocyclic group containing nitrogen as a hetero atom include the following groups.

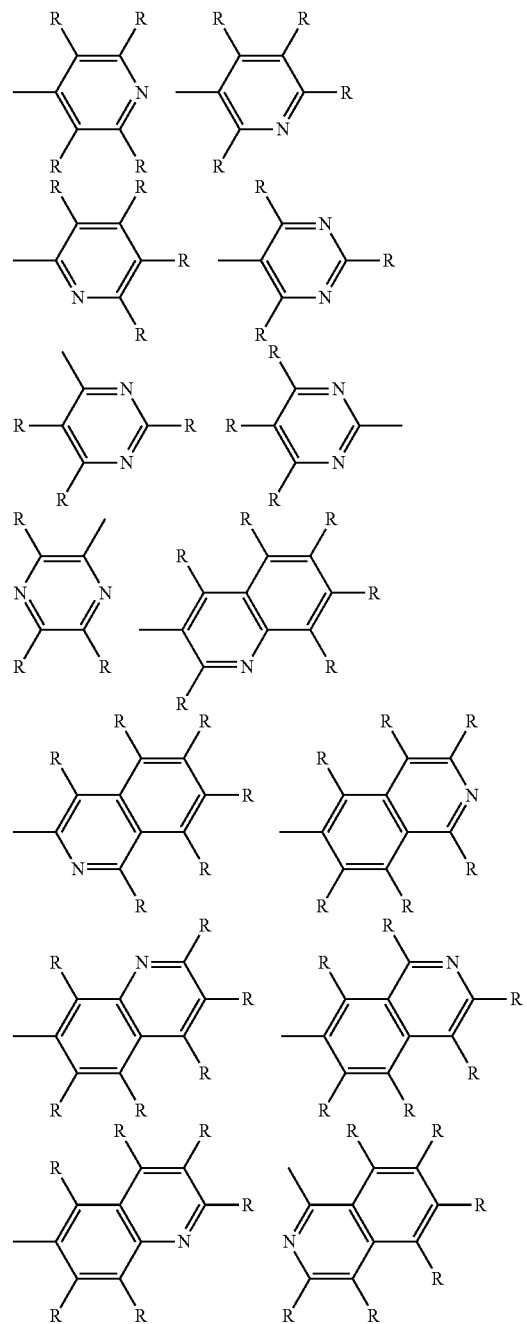

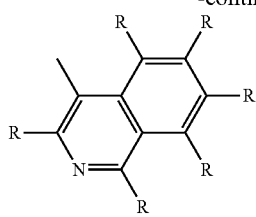 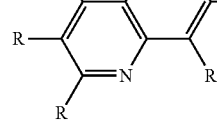 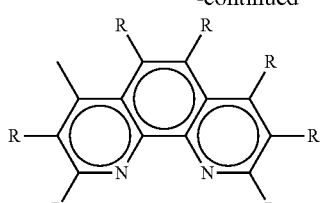
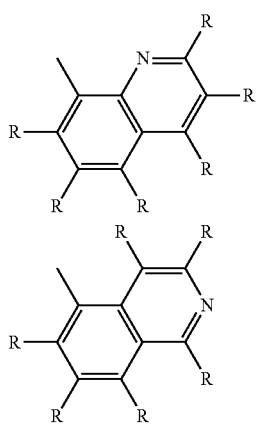 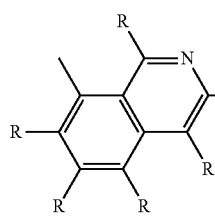 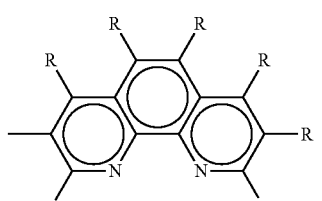
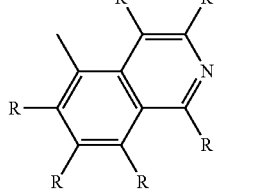 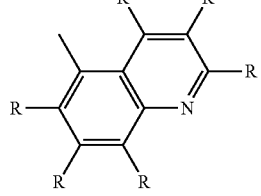
Here, R in the formulas represents the same meaning as described above.
The group containing silicon, nitrogen, oxygen, sulfur, selenium and the like as a hetero atom and having a fluorene structure includes the following groups.
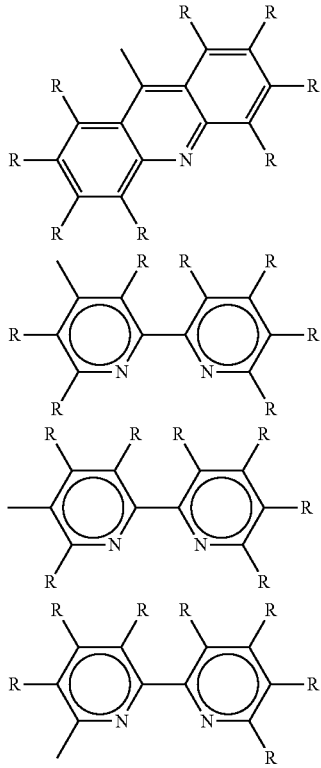
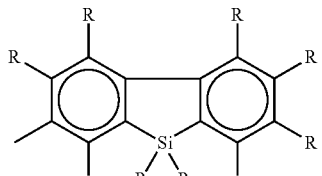
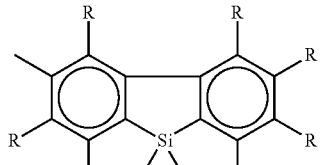
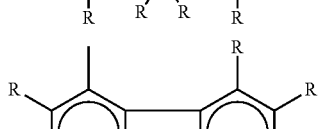
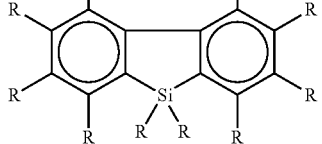
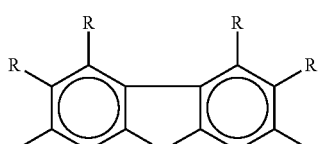
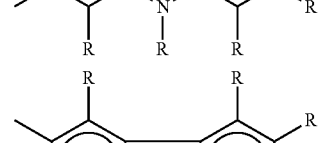
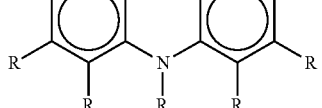

-continued

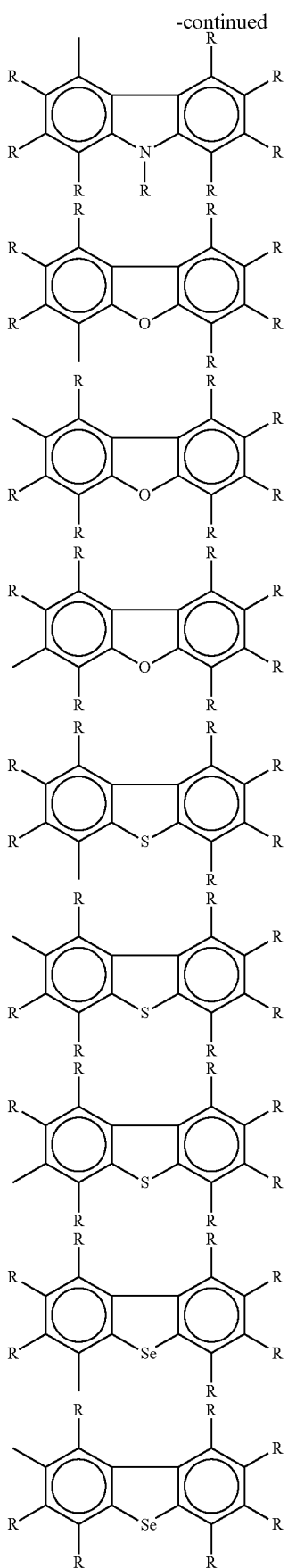

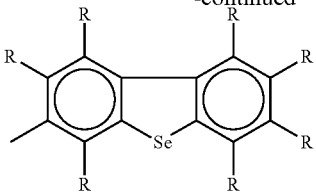

Here, R in the formulas represents the same meaning as described above.

The 5-membered heterocyclic group containing sulfur, oxygen, nitrogen, silicon, selenium and the like as a hetero atom includes the following structures.

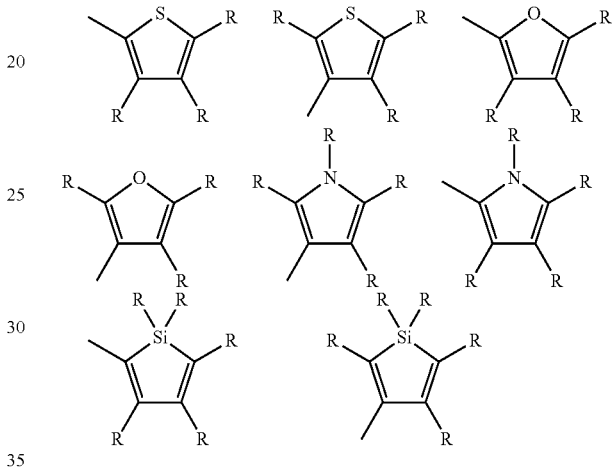

Here, R in the formulas represents the same meaning as described above.

The condensed heterocyclic group having a 5-membered ring or 6-membered ring heterocycle containing nitrogen, oxygen, sulfur, silicon, selenium and the like as a hetero atom includes the following structures.

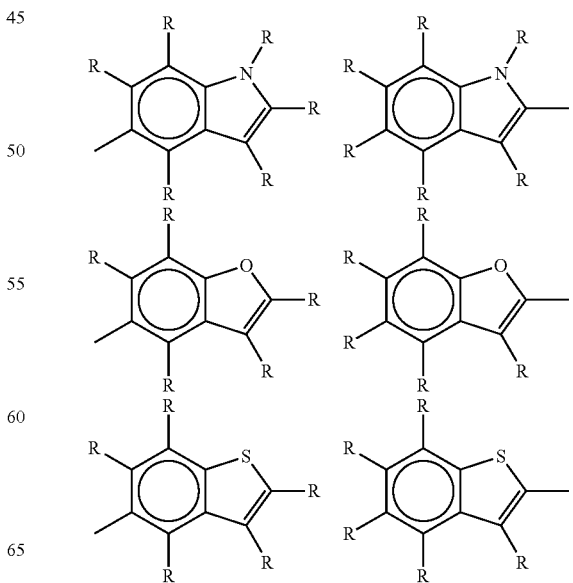

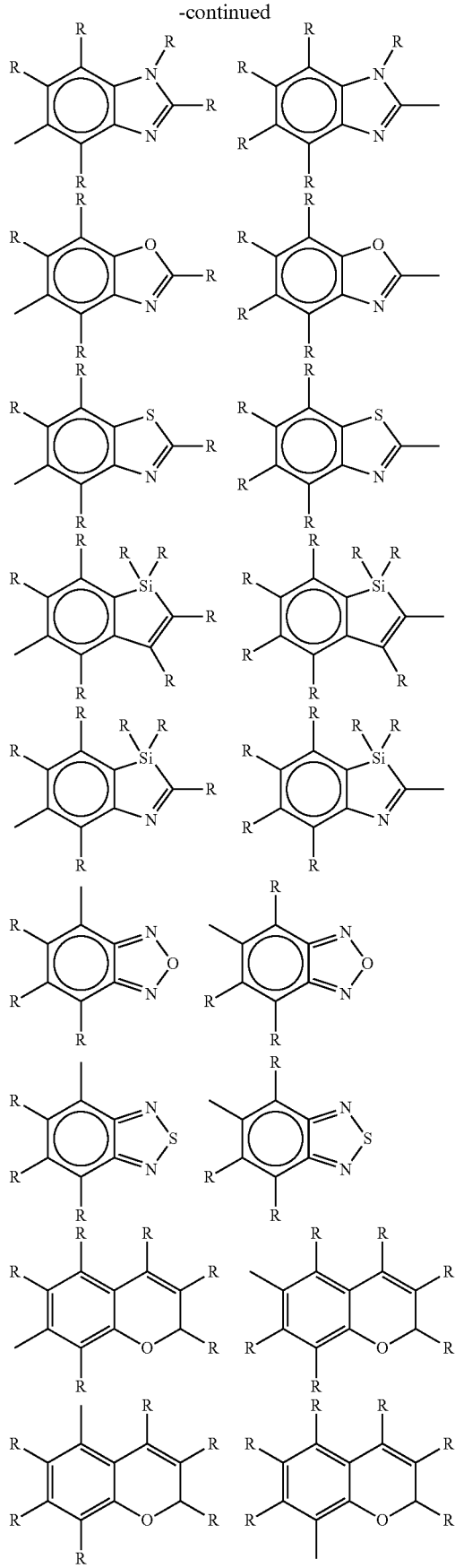

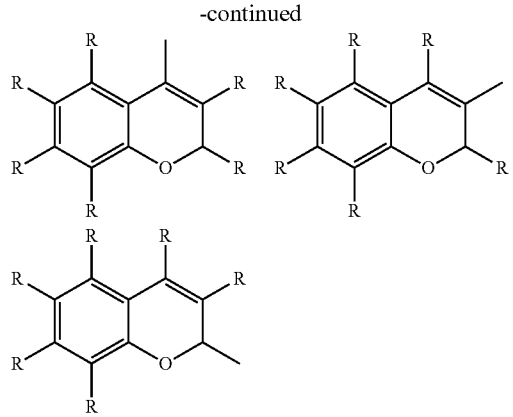

Here, R in the formulas represents the same meaning as described above.

The 5-membered ring heterocyclic groups containing silicon, nitrogen, sulfur, selenium and the like as a hetero atom, the heterocyclic groups being connected at α-position of the hetero atom to form a dimer or oligomer include the following structures.

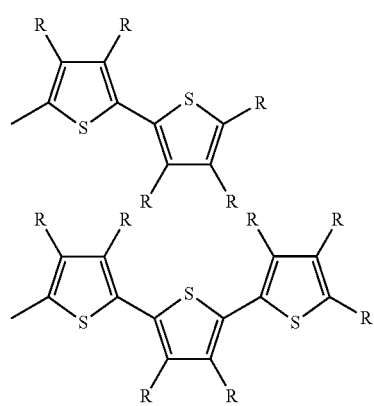

Here, R in the formulas represents the same meaning as described above.

The 5-membered ring heterocyclic groups containing nitrogen, oxygen, sulfur, silicon, selenium and the like as a hetero atom, the heterocyclic groups being connected at α-position of the hetero atom to a phenyl group include the following structures.

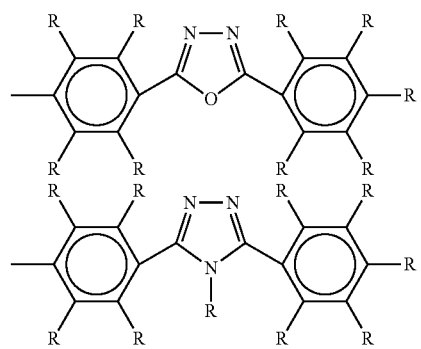

-continued

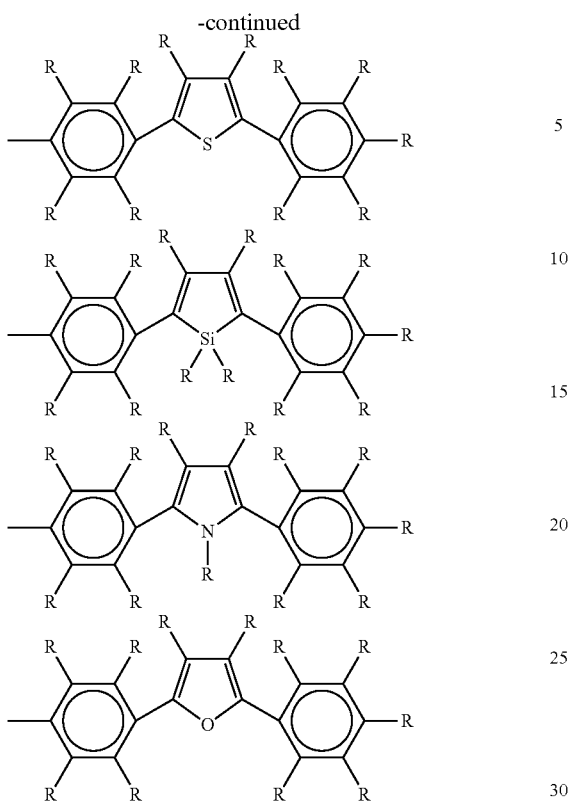

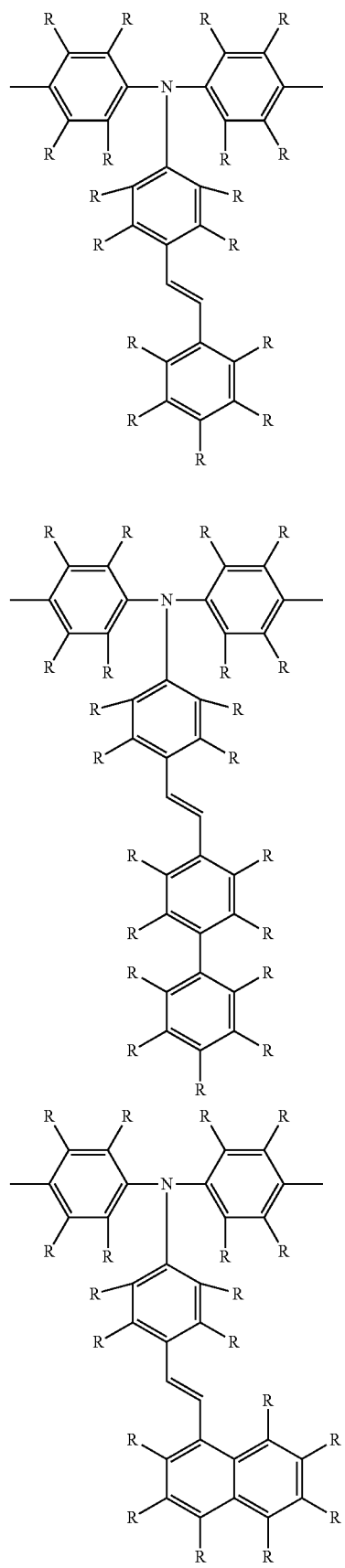

Here, R in the formulas represents the same meaning as described above.

In the formula (1), the arylene group is an atomic group in which two hydrogen atoms are removed from an aromatic hydrocarbon, and includes also those in which independent two or more benzene rings or condensed rings are bonded directly or via a group such as vinylene and the like.

The number of carbon atom of the arylene group is usually about 6 to 60, and specifically mentioned as the arylene group are a phenylene group, biphenylene group, terphenylene group, naphthalenediyl group, anthracenediyl group, phenanthrenediyl group, pentalenediyl group, indenediyl group, heptalenediyl group, indacenediyl group, triphenylenediyl group, binaphthyldiyl group, phenylnaphthylenediyl group, stilbenediyl group, fluorenediyl group, 3,3'-alkoxystilbenediyl group and the like. The number of carbon atom of the arylene group does not include the number of carbon atom of a substituent.

As specific examples of the arylene group, the above-described specific examples of the aryl group in the formula (1) in which any one of Rs is used as a connecting bond.

In the formula (1), the divalent heterocyclic group means an atomic group in which two hydrogen atoms are removed from a heterocyclic compound, and the number of carbon atom is usually about 4 to 60, preferably 4 to 20. The number of carbon atom of the mono-valent heterocyclic group does not include the number of carbon atom of a substituent.

Here, the heterocyclic compound refers to organic compounds having a cyclic structure in which elements constituting the ring include not only a carbon atom, but also a hetero atom such as oxygen, sulfur, nitrogen, phosphorus, boron and the like contained in the ring.

As specific examples of the di-valent heterocyclic group, specific examples of the mono-valent heterocyclic group described later in which any one of Rs is used as a connecting bond.

As specific structures of the repeating unit of the above-described formula (1), the following structures are exemplified.

-continued

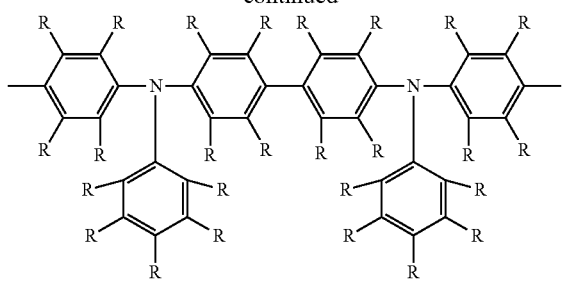

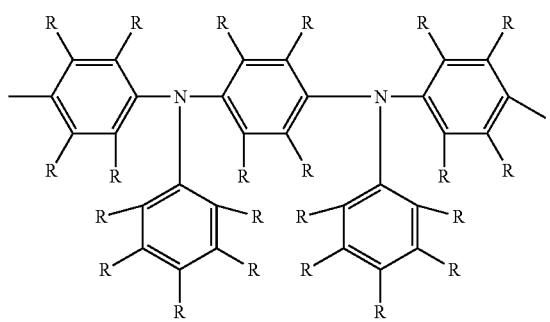

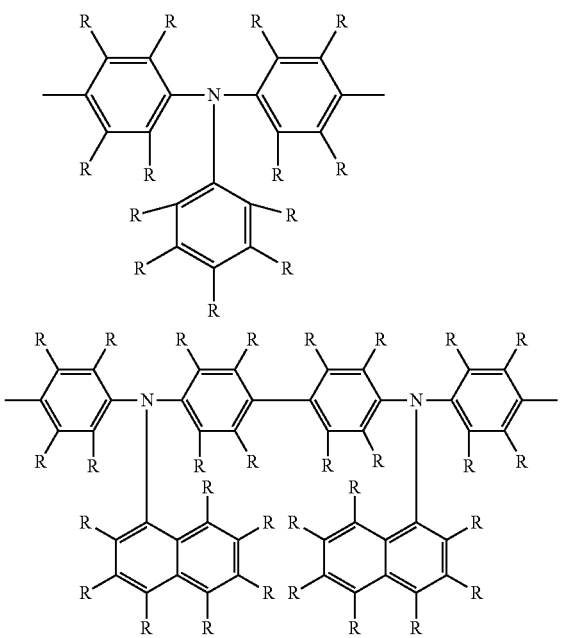

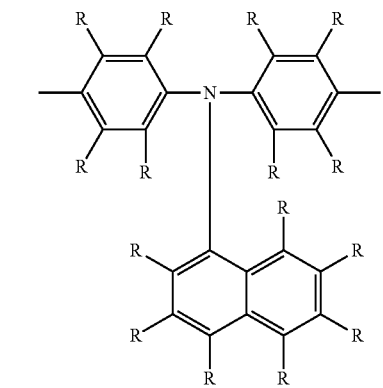

-continued

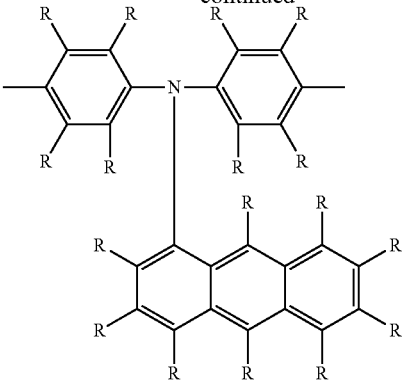

Here, R in the formulas represents the same meaning as described above.

The repeating unit (b) in the copolymer constituting the polymer composition of the present invention is preferably a repeating unit having an electron injection property or electron transportation property.

Here, as the repeating unit having an electron injection property or electron transportation property, di-valent groups are mentioned derived from low molecular weight compounds as electron injecting or electron transporting materials, and examples thereof include di-valent groups obtained by removing two hydrogen atoms from oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorenone derivatives, diphenyldicyanoethylene or its derivatives, diphenoquinone derivatives, or metal complexes of 8-hydroxyquinoline or its derivatives, polyquinoline or its derivatives, polyquinoxaline or its derivatives, and, polyfluorene or its derivatives.

The repeating unit (b) constituting the copolymer used in the present invention preferably has a structure in which conjugation is linked via a carbon having an SP2 orbital, among the above-described examples.

The repeating unit (b) is particularly preferably a unit represented by the following formula (2), among others.

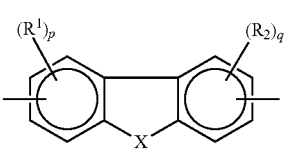

(2)

(wherein, X represents —CR$_3$R$_4$—, —O—, —S—, —Se— or —SiR$_5$R$_6$, p and q represent each independently an integer of 0 to 3, R$_1$ and R$_2$ represent each independently an alkyl group, aryl group or mono-valent heterocyclic group. Two or more of R$_1$ and R$_2$ may be connected to form a cyclic structure. R$_3$, R$_4$, R$_5$ and R$_6$ represent each independently an alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, mono-valent heterocyclic group or cyano group.

When there are a plurality of R$_1$ and R$_2$, respectively, they may be the same or different. Further, when R$_1$, R$_2$, R$_3$, R$_4$, $R_5$ and $R_6$ are groups having an alkyl, the alkyl may be interrupted by a group containing a hetero atom.).

When two or more of $R_1$s and $R_2$s are connected to form a cyclic structure, the cyclic structure may be saturated or unsaturated. Also when two or more of $R_1$s are connected to form a cyclic structure, and when two or more of $R_2$s are connected to form a cyclic structure, the cyclic structure may be saturated or unsaturated.

Here, as the hetero atom, an oxygen atom, sulfur atom, nitrogen atom and the like are exemplified.

Examples of the group containing a hetero atom include the following groups.

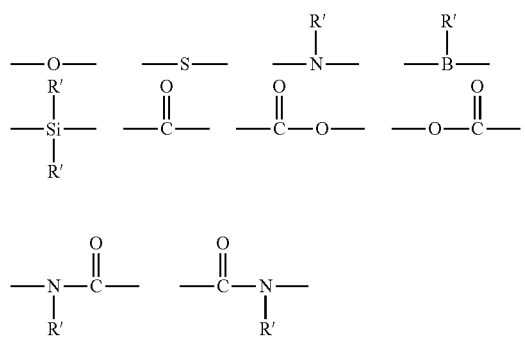

Here, as R', for example, a hydrogen atom, alkyl groups having 1 to 20 carbon atoms, aryl groups having 6 to 60 carbon atoms, and mono-valent heterocyclic groups having 4 to 60 carbon atoms are mentioned.

$R_1$ and $R_2$ in the above-described formula (2) represent each independently a hydrogen atom, alkyl group, aryl group or mono-valent heterocyclic group. $R_3$, $R_4$, $R_5$ and $R_6$ represent each independently an alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, mono-valent heterocyclic group or cyano group.

Here, the alkyl group, aryl group, mono-valent heterocyclic group, alkoxy group, alkylthio group, alkylsilyl group and alkylamino group are as described above.

The aryloxy group has a number of carbon atom of usually about 6 to 60, and specific examples thereof include a phenoxy group, $C_1$ to $C_{12}$ alkoxyphenoxy groups, $C_1$ to $C_{12}$ alkylphenoxy groups, 1-naphthyloxy group, 2-naphthyloxy group and the like, and preferable are $C_1$ to $C_{12}$ alkoxyphenoxy groups and $C_1$ to $C_{12}$ alkylphenoxy groups.

The arylsilyl group has a number of carbon atom of usually about 6 to 60, and examples thereof include a phenylsilyl group, $C_1$ to $C_{12}$ alkoxyphenylsilyl groups, $C_1$ to $C_{12}$ alkylphenylsilyl groups, 1-naphthylsilyl group, 2-naphthylsilyl group, dimethylphenylsilyl group and the like, and preferable are $C_1$ to $C_{12}$ alkoxyphenylsilyl groups and $C_1$ to $C_{12}$ alkylphenylsilyl groups.

The arylamino group has a number of carbon atom of usually about 6 to 60, and examples thereof include a phenylamino group, diphenylamino group, $C_1$ to $C_{12}$ alkoxyphenylamino groups, di($C_1$ to $C_{12}$ alkoxyphenyl) amino groups, di($C_1$ to $C_{12}$ alkylphenyl) amino groups, 1-naphthylamino group, 2-naphthylamino group and the like, and preferable are $C_1$ to $C_{12}$ alkylphenylamino groups and di($C_1$ to $C_{12}$ alkylphenyl) amino groups The arylalkyl group has a number of carbon atom of usually about 7 to 60, and specific examples thereof include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, 2-naphthyl-$C_1$ to $C_{12}$ alkyl groups and the like, and preferable are $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups.

The arylalkoxy group has a number of carbon atom of usually about 7 to 60, and specific examples thereof include phenyl-$C_1$ to $C_{12}$ alkoxy groups, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl-$C_1$ to $C_{12}$ alkoxy groups, 2-naphthyl-$C_1$ to $C_{12}$ alkoxy groups and the like, and preferable are $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups.

The arylalkylsilyl group has a number of carbon atom of usually about 7 to 60, and specific examples thereof include phenyl-$C_1$ to $C_{12}$ alkylsilyl groups, $C_1$ to $C_{12}$ alkoxyphenyl-$C_1$ to $C_{12}$ alkylsilyl groups, $C_1$ to $C_{12}$ alkylphenyl-$C_1$ to $C_{12}$ alkylsilyl groups, 1-naphthyl-$C_1$ to $C_{12}$ alkylsilyl groups, 2-naphthyl-$C_1$ to $C_{12}$ alkylsilyl groups, phenyl-$C_1$ to $C_{12}$ alkyldimethylsilyl groups and the like, and preferable are $C_1$ to $C_{12}$ alkoxyphenyl-$C_1$ to $C_{12}$ alkylsilyl groups and $C_1$ to $C_{12}$ alkylphenyl-$C_1$ to $C_{12}$ alkylsilyl groups.

The arylalkylamino group has a number of carbon atom of usually about 7 to 60, and specific examples thereof include phenyl-$C_1$ to $C_{12}$ alkylamino groups, $C_1$ to $C_{12}$ alkoxyphenyl-$C_1$ to $C_{12}$ alkylamino groups, $C_1$ to $C_{12}$ alkylphenyl-$C_1$ to $C_{12}$ alkylamino groups, di($C_1$ to $C_{12}$ alkoxyphenyl-$C_1$ to $C_{12}$ alkyl) amino groups, di($C_1$ to $C_{12}$ alkylphenyl-$C_1$ to $C_{12}$ alkyl)amino groups, 1-naphthyl-$C_1$ to $C_{12}$ alkylamino groups, 2-naphthyl-$C_1$ to $C_{12}$ alkylamino groups and the like, and preferable are $C_1$ to $C_{12}$ alkylphenyl-$C_1$ to $C_{12}$ alkylamino groups and di($C_1$ to $C_{12}$ alkylphenyl-$C_1$ to $C_{12}$ alkyl)amino groups.

The arylalkenyl group has a number of carbon atom of usually about 8 to 60, and specific examples thereof include phenyl-$C_1$ to $C_{12}$ alkenyl groups, $C_1$ to $C_{12}$ alkoxyphenyl-$C_1$ to $C_{12}$ alkenyl groups, $C_1$ to $C_{12}$ alkylphenyl-$C_1$ to $C_{12}$ alkenyl groups, 1-naphthyl-$C_1$ to $C_{12}$ alkenyl groups, 2-naphthyl-$C_1$ to $C_{12}$ alkenyl groups and the like, and preferable are $C_1$ to $C_{12}$ alkoxyphenyl-$C_1$ to $C_{12}$ alkenyl groups and $C_1$ to $C_{12}$ alkylphenyl-$C_1$ to $C_{12}$ alkenyl groups.

The arylalkynyl group has a number of carbon atom of usually about 8 to 60, and specific examples thereof include phenyl-$C_1$ to $C_{12}$ alkynyl groups, $C_1$ to $C_{12}$ alkoxyphenyl-$C_1$ to $C_{12}$ alkynyl groups, $C_1$ to $C_{12}$ alkylphenyl-$C_1$ to $C_{12}$ alkynyl groups, 1-naphthyl-$C_1$ to $C_{12}$ alkynyl groups, 2-naphthyl-$C_1$ to $C_{12}$ alkynyl groups and the like, and preferable are $C_1$ to $C_{12}$ alkoxyphenyl-$C_1$ to $C_{12}$ alkynyl groups and $C_1$ to $C_{12}$ alkylphenyl-$C_1$ to $C_{12}$ alkynyl groups.

In the above-described formula (2), p an q represent each independently an integer of 0 to 3. When q is 2 or more, a plurality of $R_2$s may be the same or different. When p is 2 or more, a plurality of $R_1$s may be the same or different. Two or more of $R_1$ to $R_6$ may be connected to form a ring. When $R_1$ to $R_6$ are groups containing an alkyl, the alkyl may be interrupted by a group containing a hetero atom.

Among structures represented by the above-described formula (2), particularly preferable are cases in which either one or both of $R_1$ and $R_2$ satisfy p, q≥2 and they form an aromatic ring. Specifically mentioned are the following structures in which p=2, q=0 and two $R_1$s form an aromatic ring.

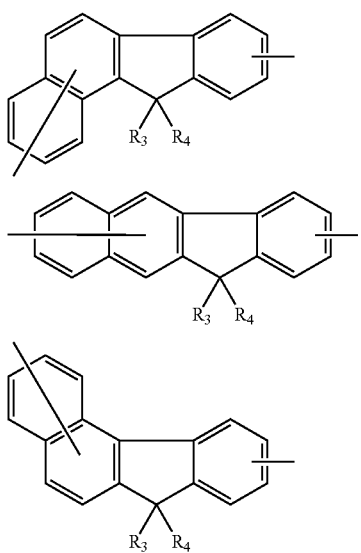
Specific examples of the structure represented by the above-described formula (2) include the following structures.
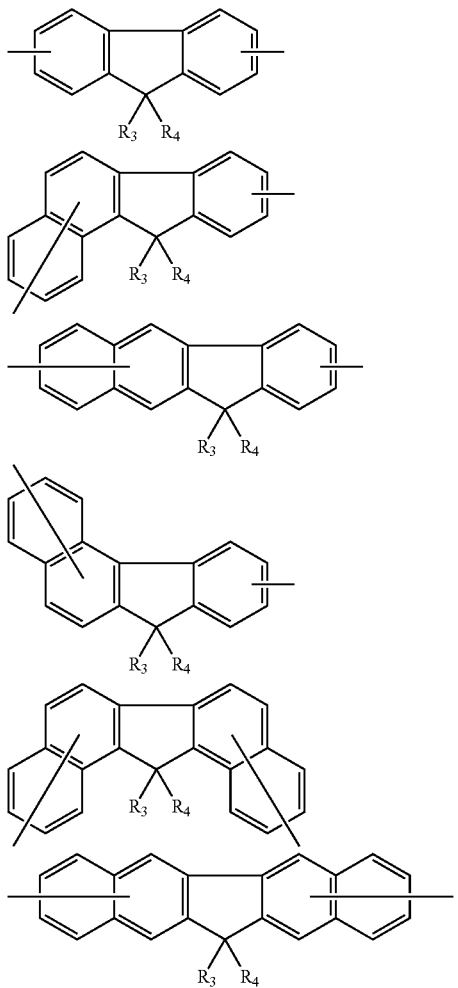
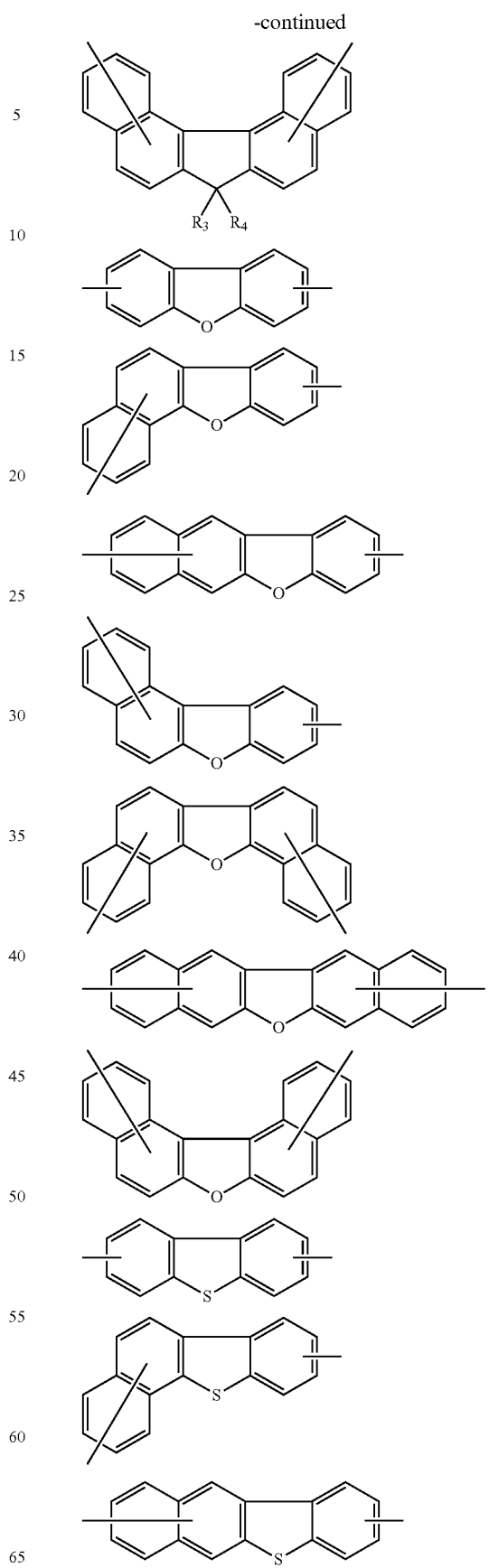

-continued
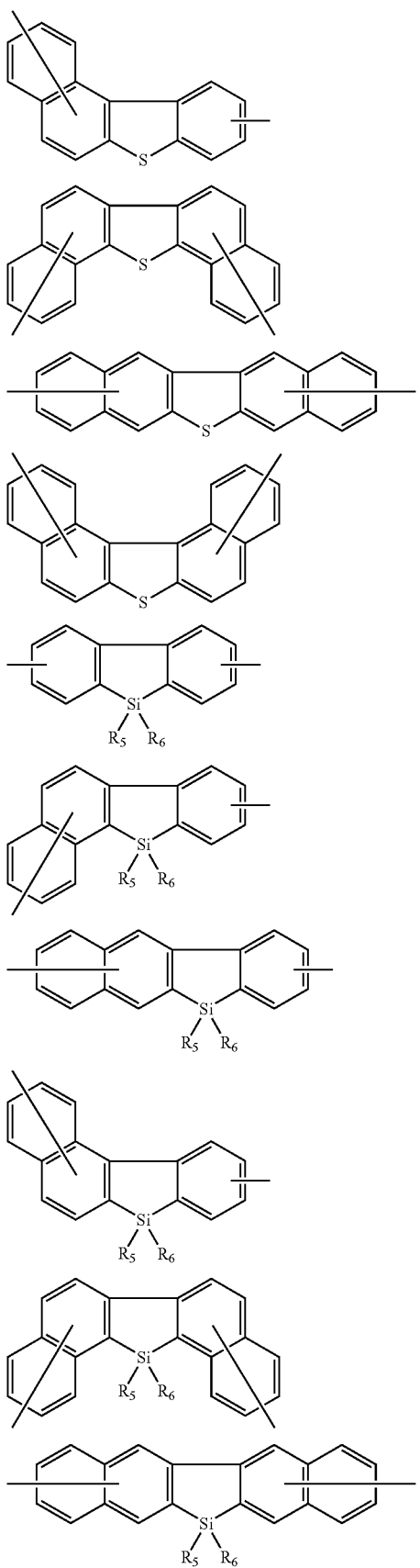
-continued
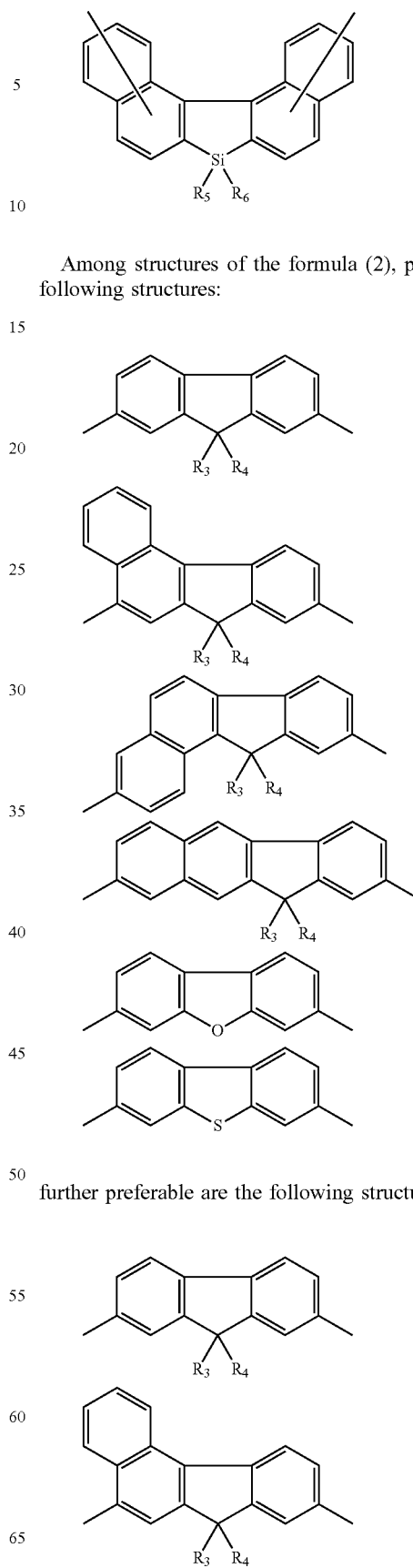
Among structures of the formula (2), preferable are the following structures:
further preferable are the following structures:

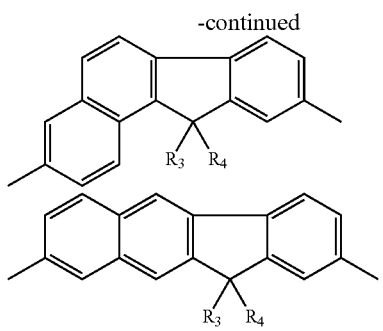

Provided that $X_{aA}$ (%) is a percentage of the mol number of a repeating unit (a) based on the sum of the mol numbers of repeating units (a) and (b) in a copolymer (A) to be used in a polymer composition of the present invention, $100 > X_{aA} > 5$ is satisfied, and provided that $X_{aB}$ (%) is a percentage of the mol number of a repeating unit (a) based on the sum of the mol numbers of repeating units (a) and (b) in a copolymer (B), a relation of $X_{aB} \leq X_{aA} - 5$ is satisfied.

By thus using a polymer composition of the present invention containing two or more copolymers containing repeating units (a) and (b) in which the content ratios of the repeating units (a) and (b) are different, a device excellent in light emission efficiency and life can be obtained, as compared with a case of use of one copolymer containing repeating units (a) and (b).

Here, it is preferable that $X_{aA}$ is in the range of 5 to 50% and $X_{aB} \leq X_{aA} - 10$.

Of them, preferable are copolymers composed of one repeating unit of the above-described formula (1) and one repeating unit of the above-described formula (2), copolymers composed of two repeating units of the above-described formula (1) and one repeating unit of the above-described formula (2), copolymers composed of one repeating unit of the above-described formula (1) and two repeating units of the above-described formula (2), copolymers composed of one repeating unit of the above-described formula (1) and one di-valent heterocyclic group, copolymers composed of two repeating units of the above-described formula (1) and one di-valent heterocyclic group, and copolymers composed of one repeating unit of the above-described formula (1) and two di-valent heterocyclic groups, more preferable are copolymers composed of one repeating unit of the above-described formula (1) and one repeating unit of the above-described formula (2), copolymers composed of two repeating units of the above-described formula (1) and one repeating unit of the above-described formula (2) and copolymers composed of one repeating unit of the above-described formula (1) and two repeating units of the above-described formula (2), and most preferable are copolymers composed of one repeating unit of the above-described formula (1) and one repeating unit of the above-described formula (2).

The polymer composition of the present invention contains 1 to 99 wt % of the above-described copolymer (A) and 99 to 1 wt % of the above-described copolymer (B). Preferable is a case containing 5 to 95% of the copolymer (A) and 95 to 5% of the copolymer (B).

The polymer composition of the present invention may contain, in addition to the above-described copolymer (A) and copolymer (B), other polymer compounds in a range not deteriorating properties when fabricated into a device such as solubility in a solvent, glass transition temperature, life, luminance and the like. Specific examples of the polymer compounds optionally contained include polymer compounds described in JP-A Nos. 2001-247861, 2001-507511, 2001-504533, 2001-278958, 2001-261796 and 2001-226469, Japanese Patent No. 3161058 and the like. The kinds of the polymer compounds include polyfluorene compounds, polyfluorene copolymers, polyarylene compounds, polyarylene copolymers, polyarylenevinylene compounds, polyarylenevinylene copolymers, polystilbene compounds, polystilbene copolymers, polystilbenevinylene compounds, polystilbenevinylene copolymers, polypyridinediyl compound, polypyridinediyl copolymers, alkoxypolythiophene compounds, alkoxypolythiophene copolymers and the like, and preferable are polyfluorene copolymers, polyarylene copolymers, polyarylenevinylene copolymers, polystilbene copolymers and polystilbenevinylene copolymers.

Examples of methods for producing the copolymer of the present invention include a method of polymerization by the Suzuki coupling reaction using a monomer corresponding to the repeating unit (Chem. Rev., vol. 95, p. 2457 (1995)), a method of polymerization by the Grignard reaction (Kyoritsu Publication, Polymer Functional Material (kobunshi kinou zairyo) series vol. 2, Synthesis and Reaction of Polymer (kobunshi no gosei to hanno) (2), pp. 432-3), a method of polymerization with a zero-valent nickel complex such as the Yamamoto coupling reaction (Prog. Polym. Sci.), vol. 17, pp. 1153-1205, 1992), a method of polymerization with an oxidizer such as $FeCl_3$ and the like, a method for electrochemical oxidation polymerization (Maruzen, Experiment Chemistry Course (Jikken Kagaku Koza), 4-th ed., vol. 28, pp. 339-340), and the like.

If necessary, two or more monomers corresponding to the same repeating unit ma be used.

Of them, the method of polymerization with a nickel catalyst or palladium catalyst such as the Suzuki coupling reaction, the method of polymerization by the Grignard reaction, and the method of condensation polymerization with a zero-valent nickel complex such as the Yamamoto coupling reaction are preferable because of easy control of the structure.

The reaction conditions will be illustrated more specifically.

In the case of the Suzuki reaction, as a catalyst, for example, palladium[tetrakis(triphenylphosphine)], palladium acetates and the like are used, and inorganic bases such as potassium carbonate, sodium carbonate, barium hydroxide and the like, organic bases such as triethylamine and the like, or inorganic salts such as cesium fluoride and the like are added in an amount of equivalent or more, preferably 1 to 10 equivalents with respect to monomers and they are reacted. It may also be permissible that an inorganic salt is used in the form of aqueous solution and the reaction is performed in two-phase system. As the solvent, N,N-dimethylformamide, toluene, dimethoxyethane, tetrahydrofuran and the like are exemplified. Depending on the solvent, temperature of about 50 to 160° C. are suitably used. The temperature may be raised up to around the boiling point of a solvent before performing reflux. The reaction temperature is about 1 hour to 200 hours.

Cases using a zero-valent nickel complex will be illustrated. Regarding the zero-valent nickel complex, there are a method of using a zero-valent nickel complex, and a method of reacting a nickel salt in the presence of a reducing agent and generating zero-valent nickel in the system.

As the zero-valent nickel complex, bis(1,5-cyclooctadiene)nickel (0), (ethylene)bis(triphenylphosphine)nickel (0), tetrakis(triphenylphosphine)nickel and the like are exemplified, and among them, bis(1,5-cyclooctadiene)nickel (0) is preferable from the standpoint of general versatility and cheapness.

It is preferable to add a neutral ligand from the standpoint of improvement in yield.

Here, the neutral ligand is a ligand having no anion and no cation, and exemplified are nitrogen-containing ligands such as 2,2'-bipyridyl, 1,10-phenanthroline, methylenebisoxazoline, N,N'-tetramethylethylenediamine and the like; tertiary phosphine ligands such as triphenylphosphine, tritolylphosphine, tributylphosphine, triphenoxyphosphine and the like, and from the standpoint of general versatility and cheapness, nitrogen-containing ligands are preferable, and 2,2'-bipyridyl is particularly preferable from the standpoint of high reactivity and high yield. Particularly, from the standpoint of improvement in yield of a polymer, a system obtained by adding 2,2'-bipyridyl as a neutral ligand to a system containing bis(1,5-cyclooctadiene)nickel (0) is preferable. In the case of a method of generating zero-valent nickel in the system, nickel chloride, nickel acetate and the like are mentioned as the nickel salt. The reducing agent includes zinc, sodium hydride, hydrazine and derivatives thereof, lithium aluminum hydride and the like, and if necessary, ammonium iodide, lithium iodide, potassium iodide and the like are used as additives.

A preferable substituent as the substituent correlated with the condensation polymerization reaction differs depending on the kind of the polymerization reaction, and in the case of use of a zero-valent nickel complex such as, for example, the Yamamoto coupling reaction and the like, mentioned are halogen atoms, alkylsulfonate groups, arylsulfonate group or arylakylsulfonate groups. In the case of polymerization by the Grignard reaction, halogen atoms are mentioned, and in the case of use of a nickel catalyst or palladium catalyst such as in the Suzuki coupling reaction and the like, halogen atoms, borate groups, boric acid group and the like are mentioned.

The organic solvent to be used for production of a copolymer of the present invention differs depending on the compound and reaction to be used, and for suppressing a side reaction, in general, it is preferable that a solvent to be used is subjected to a sufficient deoxidation treatment and the reaction is progressed in an inert atmosphere. Further, it is preferable to perform a dehydration treatment likewise. However, this is not the case when a reaction in a two-phase system with water such as the Suzuki coupling reaction is conducted.

For progressing the polymerization reaction, an alkali or suitable catalyst is appropriately added. These may be advantageously selected depending on the reaction to be used. As the alkali or catalyst, those sufficiently dissolved in the solvent used in the reaction are preferable. As the method of mixing an alkali or catalyst, there is exemplified a method in which a solution of an alkali or catalyst is added slowly while stirring the reaction liquid under an inert atmosphere such as argon and nitrogen and the like, or reversely, the reaction liquid is slowly added to a solution of an alkali or catalyst.

The polymerization time is usually about 5 minutes to 200 hours depending on the kind of polymerization, and from the standpoint of production dost, a time of not longer than 10 hours is preferable.

The polymerization temperature is usually about −50 to 160° C. depending on the kind of polymerization, and from the standpoint of high yield and low heating cost, a temperature of 20 to 100° C. is preferable.

When the polymer composition of the present invention is used in polymer LED, its purity exerts an influence on the performances of a device such as light emitting properties and the like, therefore, it is preferable that a monomer before polymerization is purified by methods of column chromatography such as distillation, sublimation purification, re-crystallization and the like before performing polymerization. Further, it is preferable that, after polymerization, a purification treatment by conventional separation operations such as acid washing, alkali washing, neutralization, water washing, organic solvent washing, re-precipitation, centrifugal separation, extraction, column chromatography, dialysis and the like; refining operations, drying and other operations, is carried out.

The ink composition of the present invention is characterized by containing the above-described polymer composition of the present invention.

The ink composition may contain, in addition to the polymer composition of the present invention, additives such as a hole transport material, electron transport material, light emitting material, solvent, stabilizer and the like.

The percentage of the polymer composition of the present invention in the ink composition is 20 wt % to 100 wt %, preferably 40 wt % to 100 wt % based on the total weight of the composition excepting a solvent.

When a solvent is contained in the ink composition, the percentage of the solvent is 1 wt % to 99.9 wt %, preferably 60 wt % to 99.9 wt %, further preferably 80 wt % to 99.5 wt % based on the total weight of the composition.

The viscosity of the ink composition varies depending on a printing method, and when an ink composition passes through a discharging apparatus such as in an ink jet printing method and the like, it is preferable that the viscosity is in the range of 1 to 20 mPa·s at 25° C. for preventing clogging in discharging and aviation curve.

The solvent to be used in the ink composition is not particularly restricted, and those capable of dissolving or uniformly dispersing materials other than the solvent constituting the ink composition are preferable. When materials constituting the ink composition are soluble in a non-polar solvent, exemplified as the solvent are chlorine-based solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

Next, applications of the polymer composition of the present invention will be described.

The polymer composition of the present invention usually shows fluorescence or phosphorescence in the solid state, and can be used as a polymer light emitter (light emitting material of high molecular weight). Polymer LED using this polymer light emitter is polymer LED of high performance which can be driven at low voltage with high efficiency. Therefore, this polymer LED can be used preferably for backlight of liquid crystalline displays, curved or flat light sources for illumination, and apparatuses such as segment type displays, dot matrix type flat panel displays and the like.

The polymer composition of the present invention can be used also as a coloring matter for laser, a material for organic solar batteries, or a material for conductive thin films such as organic semiconductors, electric conductive thin films, organic semiconductor thin films and the like for organic transistors.

Further, it can also be used as a material for light emitting thin films which emits fluorescence or phosphorescence.

The polymer LED of the present invention is characterized in that a light emitting layer is present between electrodes composed of an anode and a cathode, and the light emitting layer contains the polymer composition of the present invention.

The polymer LED of the present invention includes also a polymer light emitting device having a layer containing an electric conductive polymer provided, between at least one electrode and a light emitting layer, adjacent to the electrode, and a polymer light emitting device having an insulation layer provided, between at least one electrode and a light emitting layer, adjacent to the electrode.

Listed as the polymer LED of the present invention are polymer LED having an electron transporting layer provided between a cathode and a light emitting layer, polymer LED having a hole transporting layer provided between an anode and a light emitting layer, polymer LED having an electron transporting layer provided between a cathode and a light emitting layer, and having a hole transporting layer provided between an anode and a light emitting layer; and the like.

As the structure of the polymer LED of the present invention, the following structures a) to d) are specifically mentioned.

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode
(wherein, / means adjacent lamination of layers, applied also in the followings)

Here, the light emitting layer means a layer having a function of light emission, the hole transporting layer means a layer having a function of transporting holes, and the electron transporting layer means a layer having a function of transporting electrons. The electron transporting layer and the hole transporting layer are generically called a charge transporting layer.

Two or more light emitting layers, two or more hole transporting layers and two or more electron transporting layers may be used independently, respectively.

Among charge transporting layers provided adjacent to an electrode, those having a function of improving a charge injection efficiency from an electrode and having an effect of lowering the driving voltage of a device are, in particularly, called generally a charge injection layer (hole injection layer, electron injection layer).

Further, for improving close adherence with an electrode or improving charge injection from an electron, the above-mentioned charge injection layer or an insulation layer may be provided adjacent to the electrode, alternatively, for improving close adherence of an interface or preventing mixing, a thin insulation layer may be inserted into an interface of a charge transporting layer and a light emitting layer.

The order and number of layers to be laminated, and thickness of each layer can be appropriately determined in view of light emission efficiency and device life.

In the present invention, as the polymer LED having a charge injection layer (electron injection layer, hole injection layer) provided, mentioned are polymer LED having a charge injection layer provided adjacent to a cathode and polymer LED having a charge injection layer adjacent to an anode.

For example, the following structures e) to p) are specifically mentioned.

e) anode/charge injection layer/light emitting layer/cathode
f) anode/light emitting layer/charge injection layer/cathode
g) anode/charge injection layer/light emitting layer/charge injection layer/cathode
h) anode/charge injection layer/hole transporting layer/light emitting layer/cathode
i) anode/hole transporting layer/light emitting layer/charge injection layer/cathode
j) anode/charge injection layer/hole transporting layer/light emitting layer/charge injection layer/cathode
k) anode/charge injection layer/light emitting layer/electron transporting layer/cathode
l) anode/light emitting layer/electron transporting layer/charge injection layer/cathode
m) anode/charge injection layer/light emitting layer/electron transporting layer/charge injection layer/cathode
n) anode/charge injection layer/hole transporting layer/light emitting layer/charge transporting layer/cathode
o) anode/hole transporting layer/light emitting layer/electron transporting layer/charge injection layer/cathode
p) anode/charge injection layer/hole transporting layer/light emitting layer/electron transporting layer/charge injection layer/cathode As specific examples of the charge injection layer, exemplified are
a layer containing an electric conductive polymer,
a layer provided between an anode and a hole transporting layer and containing a material having ionization potential of a value between an anode material and a hole transport material contained in a hole transporting layer, a layer provided between a cathode and an electron transporting layer and containing a material having electron affinity of a value between a cathode material and an electron transport material contained in an electron transporting layer, and the like.

When the above-mentioned charge injection layer contains an electric conductive polymer, the electric conductivity of the electric conductive polymer is preferably $10^{-5}$ S/cm or more and $10^3$ or less, and for decreasing leak current between light emission picture elements, more preferably $10^{-5}$ S/cm or more and $10^2$ or less, further preferably $10^{-5}$ S/cm or more and $10^1$ or less.

When the above-mentioned charge injection layer contains an electric conductive polymer, the electric conductivity of the electric conductive polymer is preferably $10^{-5}$ S/cm or more and $10^3$ or less, and for decreasing leak current between light emission picture elements, more preferably $10^{-5}$ S/cm or more and $10^2$ or less, further preferably $10^{-5}$ S/cm or more and $10^1$ or less.

Usually, for adjusting the electric conductivity of the electric conductive polymer to $10^{-5}$ S/cm or more and $10^3$ or less, the electric conductive polymer is doped with a suitable amount of ions.

As the kind of ions to be doped, an anion is used in a hole injection layer and a cation is used in an electron injection layer. Examples of the anion include a polystyrenesulfonic ion, alkylbenzenesulfonic ion, camphorsulfonic ion and the like, and examples of the cation include a lithium ion, sodium ion, potassium ion, tetrabutylammonium ion and the like.

The thickness of the charge injection layer is, for example, 1 nm to 100 nm, preferably 2 nm to 50 nm.

The material used in the charge injection layer may be appropriately selected depending on a relation with the material of an electrode and an adjacent layer, and exemplified are polyaniline and its derivatives, polythiophene and its derivatives, polypyrrole and its derivatives, polyphenylenevinylene and its derivatives, polythienylenevinylene and its derivatives, polyquinoxaline and its derivatives, electric conductive polymers such as polymers containing an aromatic amine structure in a side chain or main chain, metal phthalocyanine (copper phthalocyanine and the like), carbon and the like.

The insulation layer has a function of making charge injection easy. As the material of the above-described insulation layer, metal fluorides, metal oxides, organic insulation materials and the like are mentioned. As the polymer LED carrying an insulation layer provided, there are mentioned polymer LED in which an insulation layer is provided adjacent to a cathode, and polymer LED in which an insulation layer is provided adjacent to an anode. The insulation layer has an average film thickness of for example 10 nm or less, preferably 0.1 to 10 nm, more preferably 0.3 to 8 nm, further preferably 0.5 to 5 nm.

Specifically, the following structures q) to ab) are mentioned, for example.

q) anode/insulation layer/light emitting layer/cathode
r) anode/light emitting layer/insulation layer/cathode
s) anode/insulation layer/light emitting layer/insulation layer/cathode
t) anode/insulation layer/hole transporting layer/light emitting layer/cathode
u) anode/hole transporting layer/light emitting layer/insulation layer/cathode
v) anode/insulation layer/hole transporting layer/light emitting layer/insulation layer/cathode
w) anode/insulation layer/light emitting layer/electron transporting layer/cathode
x) anode/light emitting layer/electron transporting layer/insulation layer/cathode
y) anode/insulation layer/light emitting layer/electron transporting layer/insulation layer/cathode
z) anode/insulation layer/hole transporting layer/light emitting layer/electron transporting layer/cathode
aa) anode/hole transporting layer/light emitting layer/electron transporting layer/insulation layer/cathode
ab) anode/insulation layer/hole transporting layer/light emitting layer/electron transporting layer/insulation layer/cathode The light emitting layer contains the copolymer or polymer composition of the present invention, and light emitting materials other than the above-described copolymer may be mixed in the light emitting layer. In the polymer LED of the present invention, a light emitting layer containing a light emitting material other than the above-described polymer fluorescent body may be laminated with a light emitting layer containing the above-described copolymer.

As the light emitting material, known materials can be used. For compounds of low molecular weight, for example, naphthalene derivatives, anthracene or derivatives thereof, perylene or derivatives thereof; polymethine, xanthene, coumarin and cyanine coloring matters; metal complexes of 8-hydroxyquinoline or derivatives thereof; aromatic amines, tetraphenylcyclopentadiene or derivatives thereof, tetraphenylbutadiene or derivatives thereof, and the like can be used.

Specifically, known compounds such as those described in, for example, JP-A Nos. 57-51781, 59-194393, and the like can be used.

Though method for forming a light emission layer is not limited, for example, a method of film formation from a solution is exemplified.

As the film formation method from a solution, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

As the solvent to be used for film formation from a solution, toluene, xylene, chloroform and tetrahydrofuran are exemplified.

The thickness of a light emission layer shows optimum value varying depending on the material to be used and may be advantageously selected so as to give suitable driving voltage and light emission efficiency, and it is, for example, 1 nm to 1 μm, preferably 2 nm to 500 nm, further preferably 5 nm to 200 nm.

When the polymer LED of the present invention has a hole transporting layer, exemplified as the hole transporting material to be used are polyvinylcarbazole or derivatives thereof, polysilane or derivatives thereof, polysiloxane derivatives having an aromatic amine in a side chain or main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, and the like.

Specifically, exemplified as the hole transport material are those described in JP-A Nos. 63-70257, 63-175860, 2-135359, 2-135361, 2-209988, 3-37992 and 3-152184, and the like.

Among them, preferable as the hole transport material used in a hole transporting layer are polymer hole transport materials such as polyvinylcarbazole or derivatives thereof, polysilane or derivatives thereof, polysiloxane derivatives having an aromatic amine compound group in a side chain or main chain, polyaniline or derivatives thereof, polythiophene or derivatives thereof, poly(p-phenylenevinylene) or derivatives thereof, poly(2,5-thienylenevinylene) or derivatives thereof, and the like, and polyvinylcarbazole or derivatives thereof, polysilane or derivatives thereof, polysiloxane derivatives having an aromatic amine in a side chain or main chain are further preferable. In the case of the hole transport material of low molecular weight, dispersion in a polymer binder before use is preferable.

Polyvinylcarbazole or derivatives thereof are obtained, for example, from vinyl monomers by cation polymerization or radical polymerization.

As the polysilane or derivatives thereof, compounds described in Chem. Rev., vol. 89, p. 1359 (1989), GB Patent No. 2300196 publication, and the like are exemplified. Also as the synthesis method, methods described in them can be used, and particularly, a Kipping method is suitably used.

In the polysiloxane or derivatives thereof, the siloxane skeleton structure shows little hole transport property, thus, those having a structure of the above-mentioned hole transport material of low molecular weight in a side chain or main chain are suitably used Particularly, those having an aromatic amine showing a hole transport property in a side chain or main chain are exemplified.

The film formation method of a hole transporting layer is not particularly restricted, and in the case of a hole transport material of low molecular weight, a method of film formation from a mixed solution with a polymer binder is exemplified. In the case of a hole transport material of high molecular weight, a method of film formation from a solution is exemplified.

The solvent used for film formation from a solution is not particularly restricted providing it can dissolve a hole transport material. Exemplified as the solvent are chlorine-based solvents such as chloroform, methylene chloride, 1,2-dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the method for film formation from a solution, there can be used application methods from a solution such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like.

As the polymer binder to be mixed, those not extremely disturbing charge transportation are preferable, and those showing no strong absorption for visible light are suitably used. As the polymer binder, exemplified are polycarbonate, polyacrylate, polymethyl acrylate, polymethyl methacrylate, polystyrene, polyvinyl chloride, polysiloxane and the like.

The thickness of a hole transporting layer shows optimum value varying depending on the material to be used and may be advantageously selected so as to give suitable driving voltage and light emission efficiency, and at least thickness not generating pin holes is necessary, and too large thickness causes increase in the driving voltage of a device, thus, is not preferable. Therefore, the thickness of the hole transporting layer is, for example, 1 nm to 1 μm, preferably 2 nm to 500 nm, further preferably 5 nm to 200 nm.

When the polymer LED of the present invention has an electron transporting layer, known materials can be used as the electron transport material to be used, and exemplified are oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, metal complexes of 8-hydroxyquinoline or derivatives thereof, polyquinoline or derivatives thereof, polyquinoxaline or derivatives thereof, polyfluorene or derivatives thereof, and the like.

Specifically, those described in JP-A Nos. 63-70257, 63-175860, 2-135359, 2-135361, 2-209988, 3-37992, 3-152184, and the like are exemplified.

Of them, oxadiazole derivatives, benzoquinone or derivatives thereof, anthraquinone or derivatives thereof, metal complexes of 8-hydroxyquinoline or derivatives thereof, polyquinoline or derivatives thereof, polyquinoxaline or derivatives thereof, polyfluorene or derivatives thereof are preferable, and 2-(4-biphenylyl)-5-(4-t-butylphenyl)-1,3,4-oxadiazole, benzoquinone, anthraquinone, tris(8-quinolinol) aluminum and polyquinoline are further preferable.

The film formation method of an electron transporting layer is not particularly restricted, and in the case of an electron transport material of low molecular weight, exemplified are a vacuum vapor-deposition method from powder, film formation methods from solution or melted condition, and in the case of an electron transport material of high molecular weight, film formation methods from solution or melted condition are exemplified, respectively. In film formation from solution or melted condition, the above-mentioned polymer binder may be used together.

The solvent used in film formation from a solution is not particularly restricted providing it can dissolve an electron transport material and/or polymer binder. Exemplified as the solvent are chlorine-based solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film formation method from solution or melted condition, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

As the polymer binder to be mixed, those not extremely disturbing charge transportation are preferable, and those showing no strong absorption for visible light are suitably used. As the polymer binder, exemplified are poly(N-vinylcarbazole), polyaniline or derivatives thereof, polythiophene or derivatives thereof, poly(p-phenylenevinylene) or derivatives thereof, poly(2,5-thienylenevinylene) or derivatives thereof, polycarbonate, polyacrylate, polymethyl acrylate, polymethyl methacrylate, polystyrene, polyvinyl chloride, polysiloxane and the like.

The thickness of an electron transporting layer shows optimum value varying depending on the material to be used and may be advantageously selected so as to give suitable driving voltage and light emission efficiency, and at least thickness not generating pin holes is necessary, and too large thickness causes increase in the driving voltage of a device, thus, is not preferable. Therefore, the thickness of the electron transporting layer is, for example, 1 nm to 1 μm, preferably 2 nm to 500 nm, further preferably 5 nm to 200 nm.

The substrate for forming the polymer LED of the present invention may advantageously be a substrate which forms an electrode and does not vary in forming a layer of an organic substance, and for example, glass, plastic, polymer film, silicon substrates and the like are exemplified. In the case of an opaque substrate, it is preferable that the counter electrode is transparent or semi-transparent.

Usually, it is preferable that at least one of electrodes composed of an anode and a cathode is transparent or semi-transparent, and the anode side is transparent or semi-transparent. As the material of the anode, an electric conductive metal oxide film, semi-transparent metal membrane and the like are used. Specifically, films (NESA and the like) formed using electric conductive glass composed of indium oxide, zinc oxide, tin oxide, and composite thereof: indium.tin.oxide (ITO), indium.zinc.oxide and the like, gold, platinum, silver, copper and the like are used, and ITO, indium.zinc.oxide, tin oxide are preferable. As the manufacturing method, a vacuum vapor-deposition method, sputtering method, ion plating method, plating method and the like are mentioned. As the anode, organic transparent electric conductive films made of polyaniline or derivatives thereof, polythiophene or derivatives thereof, and the like may be used.

The thickness of an anode can be appropriately selected in view of light transmission and electric conductivity, and it is, for example, 10 nm to 10 μm, preferably 20 nm to 1 μm, further preferably 50 nm to 500 nm.

For making charge injection easy, a layer made of a phthalocyanine derivative, electric conductive polymer, carbon and the like, or a layer having an average thickness of 4 nm or less made of a metal oxide, metal fluoride, organic insulation material and the like, may be provided on an anode.

As the material of a cathode used in polymer LED of the present invention, materials of small work function are preferable. For example, metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys of two or more of them, or alloys made of at least one of them and at least one of gold, silver, platinum, copper, manganese, titanium, cobalt, nickel, tungsten and tin, graphite or graphite interlaminar compounds and the like are used. Examples of the alloy include magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may take a laminated structure consisting of two or more layers.

The thickness of a cathode can be appropriately selected in view of electric conductivity and durability, and it is, for example, 10 nm to 10 µm, preferably 20 nm to 1 µm, further preferably 50 nm to 500 nm.

As the cathode manufacturing method, a vacuum vapor-deposition method, sputtering method, lamination method of thermally press-binding a metal thin film, and the like are used. A layer made of an electric conductive polymer, or a layer having an average thickness of 4 nm or less made of a metal oxide, metal fluoride, organic insulation material and the like, may be provided between a cathode and an organic substance layer, and after manufacturing a cathode, a protective layer for protecting the polymer LED may be installed. For use of the polymer LED stably for a long period of time, it is preferable to install a protective layer and/or protective cover, for protecting a device from outside.

As the protective layer, a polymer compound, metal oxide, metal fluoride, metal boride and the like can be used. As the protective cover, a glass plate, and a plastic plate having a surface subjected to low water permeation treatment, and the like can be used, and a method of pasting the cover to a device substrate with a thermosetting resin or photo-curable resin to attain sealing is suitably used. When a space is kept using a spacer, blemishing of a device can be prevented easily. If an inert gas such as nitrogen, argon and the like is filled in this space, oxidation of a cathode can be prevented, further, by placing a drying agent such as barium oxide and the like in this space, it becomes easy to suppress moisture adsorbed in a production process from imparting damage to the device. It is preferable to adopt one strategy among these methods.

The polymer light emitting device of the present invention can be used as a sheet light source, segment display, dot matrix display, back light of a liquid crystalline display.

For obtaining light emission in the form of sheet using the polymer LED of the present invention, it may be advantages to place a sheet anode and a sheet cathode so as to overlap. For obtaining light emission in the form of pattern, there are a method in which a mask having a window in the form of pattern is placed on the surface of the above-mentioned sheet light emitting device, a method in which an organic substance layer in non-light emitting parts is formed with extremely large thickness to give substantially no light emission, a method in which either and anode or cathode, or both electrodes are formed in the form pattern. By forming a pattern by any of these methods, and placing several electrodes so that on/off is independently possible, a display of segment type is obtained which can display digits, letters, simple marks and the like. Further, for providing a dot matrix device, it may be permissible that both an anode and a cathode are formed in the form of stripe, and placed so as to cross. By using a method in which several polymer fluorescent bodies showing different emission colors are painted separately or a method in which a color filter or a fluorescence conversion filter is used, partial color display and multi-color display are made possible. In the case of a dot matrix element, passive driving is possible, and active driving may be carried out in combination with TFT and the like. These displays can be used as a display of a computer, television, portable terminal, cellular telephone, car navigation, view finder of video camera, and the like.

Further, the above-mentioned sheet light emitting device is of self emitting and thin type, and can be used suitably as a sheet light source for back light of a liquid crystalline display, or as a sheet light source for illumination. If a flexible substrate is used, it can also be used as a curved light source or display.

Examples for illustrating the present invention further in detail will be shown below, but the invention is not limited to them.

The polystyrene-reduced number average molecular weight was measured by SEC.

Column: TOSOH TSKgel Super HM-H (two)+TSKgel Super H2000 (4.6 mm I.d.×15 cm), and detector: RI (SHIMADZU RID-10A) were used. As the mobile phase, tetrahydrofuran (THF) was used.

Synthesis Example 1

Synthesis of Copolymer 1

2,7-dibromo-9,9-dioctylfluorene (0.99 g, 1.8 mmol), N,N'-bis(4-bromophenyl)-N,N'-(bis-4-n-butylphenyl)-1,4-phenylenediamine (0.041 g, 0.06 mmol) and 2,2'-bipyridyl (0.53 g, 3.4 mmol) were dissolved in 40 mL of dehydrated tetrahydrofuran, then, an atmosphere in the system was purged with nitrogen by bubbling of nitrogen. Under a nitrogen atmosphere, to this solution was added bis(1,5-cyclooctadiene)nickel (0) {Ni(COD)$_2$} (0.92 g, 3.3 mmol), and the mixture was reacted up to 60° C. and reacted for 3 hours while stirring. After the reaction, this reaction solution was cooled down to room temperature (about 25° C.), and dropped into a mixed solution of 25% ammonia water 4 mL/methanol 40 mL/ion exchanged water 40 mL, and the mixture was stirred, then, the deposited precipitate was filtrated and dried under reduced pressure for 2 hours, then, dissolved in 40 mL of toluene before performing filtration, and the filtrate was purified by passing through an alumina column, and about 40 mL of 4% ammonia water was added and the mixture was stirred for 2 hours, then, the aqueous layer was removed. The organic layer was dropped into about 120 mL of methanol and the mixture was stirred for 1 hour, and subjected to filtration and drying under reduced pressure for 2 hours. The resultant copolymer (hereinafter, referred to as copolymer 1) revealed a yield of 0.25 g. The polystyrene reduced number average molecular weight and weight average molecular weight were, Mn=8.6×10$^4$ and Mw=1.8×10$^5$, respectively.

Synthesis Example 2

Synthesis of Copolymer 2

2,7-dibromo-9,9-dioctylfluorene (5.8 g, 10.5 mmol), N,N'-bis(4-bromophenyl)-N,N'-(bis-4-n-butylphenyl)-1,4- phen ylenediamine (3.1 g, 4.5 mmol) and 2,2'-bipyridyl (6.6 g, 42 mmol) were dissolved in 400 mL of dehydrated tetrahydrofuran, then, an atmosphere in the system was purged with nitrogen by bubbling of nitrogen. Under a nitrogen atmosphere, to this solution was added bis(1,5-cyclooctadiene)nickel (0) {Ni(COD)$_2$} (12 g, 44 mmol), and the mixture was reacted up to 60° C. and reacted for 3 hours while stirring. After the reaction, this reaction solution was cooled down to room temperature (about 25° C.), and dropped into a mixed solution of 25% ammonia water 100 mL/methanol 200 mL/ion exchanged water 300 mL, and the mixture was stirred, then, the deposited precipitate was filtrated and dried under reduced pressure, and heated at 50° C. and dissolved in 350 mL of toluene. Thereafter, purification thereof was carried out through an aluminum column, and about 400 mL of 4% ammonia water was added to this and the mixture was stirred for 2 hours, then, the aqueous layer was removed. To the organic layer was added about 400 mL of ion exchanged water and the mixture was stirred for 1 hour, then, the aqueous layer was removed. The organic layer was dropped into about 1200 mL of methanol and the mixture was stirred for 1 hour, and subjected to filtration and drying under reduced pressure for 2 hours. The resultant copolymer (hereinafter, referred to as copolymer 2) revealed a yield of 3.5 g.

The copolymer 2 had a polystyrene reduced number average molecular weight of $3.4 \times 10^4$ and a polystyrene reduced weight average molecular weight of $2.0 \times 10^5$.

Synthesis Example 3

Synthesis of Copolymer 3

2,7-dibromo-9,9-dioctylfluorene (0.65 g, 1.2 mmol), N,N'-bis(4-bromophenyl)-N,N'-(bis-4-n-butylphenyl)-1,4-phen ylenediamine (0.09 g, 0.13 mmol) and 2,2'-bipyridyl (0.51 g, 3.3 mmol) were dissolved in 40 mL of dehydrated tetrahydrofuran, then, an atmosphere in the system was purged with nitrogen by bubbling of nitrogen. Under a nitrogen atmosphere, to this solution was added bis(1,5-cyclooctadiene)nickel (0) {Ni(COD)$_2$} (0.91 g, 3.3 mmol), and the mixture was reacted up to 60° C. and reacted for 3 hours while stirring. After the reaction, this reaction solution was cooled down to room temperature (about 25° C.), and dropped into a mixed solution of 25% ammonia water 4 mL/methanol 40 mL/ion exchanged water 40 mL, and the mixture was stirred, then, the deposited precipitate was filtrated and dried under reduced pressure for 2 hours, then, dissolved in 40 mL of toluene before performing filtration, and the filtrate was purified through an aluminum column, and about 40 mL of 4% ammonia water was added to this and the mixture was stirred for 2 hours, then, the aqueous layer was removed. To the organic layer was added about 40 mL of ion exchanged water and the mixture was stirred for 1 hour, then, the aqueous layer was removed. The organic layer was dropped into about 120 mL of methanol and the mixture was stirred for 1 hour, and subjected to filtration and drying under reduced pressure for 2 hours. The resultant copolymer (hereinafter, referred to as copolymer 3) revealed a yield of 0.20 g. The polystyrene reduced number average molecular weight and weight average molecular weight were, Mn=$1.3 \times 10^5$ and Mw=$7.3 \times 10^5$, respectively.

Synthesis Example 4

Synthesis of Copolymer 4

The following compound A (4.8 g, 7.9 mmol), N,N'-bis(4-bromophenyl)-N,N'-bis(4-t-butyl-2,6-dimethylphen yl)-1,4-phenylenediamine (0.31 g, 0.42 mmol) and 2,2'-bipyridyl (3.5 g, 23 mmol) were dissolved in 211 mL of dehydrated tetrahydrofuran, then, an atmosphere in the system was purged with nitrogen by bubbling of nitrogen. Under a nitrogen atmosphere, this solution was reacted up to 60° C. and, bis(1,5-cyclooctadiene)nickel (0) {Ni(COD)$_2$} (6.2 g, 23 mmol) was added to this at 60° C., and the mixture was reacted for 3 hours while stirring. After the reaction, this reaction solution was cooled down to room temperature (about 25° C.), and dropped into a mixed solution of 25% ammonia water 30 mL/methanol 200 mL/ion exchanged water 200 mL, and the mixture was stirred, then, the deposited precipitate was filtrated and dried under reduced pressure for 2 hours, then, dissolved in 250 mL of toluene before performing filtration, and the filtrate was purified through an aluminum column, and about 250 mL of 4% ammonia water was added to this and the mixture was stirred for 2 hours, then, the aqueous layer was removed. To the organic layer was added about 250 mL of ion exchanged water and the mixture was stirred for 1 hour, then, the aqueous layer was removed.

Into the organic layer was dropped about 50 mL of methanol and the mixture was stirred for 1 hour, and the supernatant was removed by decantation. The resultant precipitate was dissolved in 100 mL of toluene, and the resultant solution was dropped into about 200 mL of methanol and the mixture was stirred for 1 hour, and filtrated and dried under reduced pressure for 2 hours. The resultant copolymer (hereinafter, referred to as copolymer 4) revealed a yield of 3.1 g. The polystyrene reduced number average molecular weight and weight average molecular weight were, Mn=$1.3 \times 10^5$ and Mw=$4.6 \times 10^5$, respectively.

(compound A)

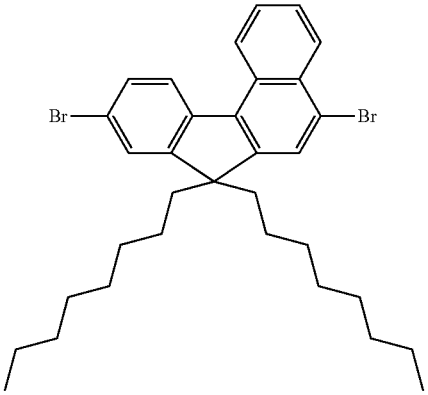

Synthesis Example 5

Synthesis of Copolymer 5

The above-described compound A (7.3 g, 12 mmol), N,N'-bis(4-bromophenyl)-N,N'-bis(4-t-butyl-2,6-dimethyl-phen yl)-1,4-phenylenediamine (0.19 g, 0.25 mmol) and 2,2'-bipyridyl (9.3 g, 34 mmol) were dissolved in 450 mL of dehydrated tetrahydrofuran, then, an atmosphere in the system was purged with nitrogen by bubbling of nitrogen. Under a nitrogen atmosphere, this solution was reacted up to 60° C. and, bis(1,5-cyclooctadiene)nickel (0) {Ni(COD)$_2$} (9.3 g, 34 mmol) was added to this at 60° C., and the mixture was reacted for 3 hours while stirring. After the reaction, this reaction solution was cooled down to room temperature (about 25° C.), and dropped into a mixed solution of 25% ammonia water 45 mL/methanol 450 mL/ion exchanged water 450 mL, and the mixture was stirred, then, the deposited precipitate was filtrated and dried under reduced pressure for 2 hours, then, dissolved in 700 mL of toluene before performing filtration, and the filtrate was purified through an aluminum column, and about 700 mL of 4% ammonia water was added to this and the mixture was stirred for 2 hours, then, the aqueous layer was removed. To the organic layer was added about 700 mL of ion exchanged water and the mixture was stirred for 1 hour, then, the aqueous layer was removed.

Into the organic layer was dropped about 150 mL of methanol and the mixture was stirred for 1 hour, and the supernatant was removed by decantation. The resultant precipitate was dissolved in 300 mL of toluene, and the resultant solution was dropped into about 600 mL of methanol and the mixture was stirred for 1 hour, and filtrated and dried under reduced pressure for 2 hours. The resultant copolymer (hereinafter, referred to as copolymer 5) revealed a yield of 4.7 g. The polystyrene reduced number average molecular weight and weight average molecular weight were, $Mn=7.6 \times 10^4$ and $Mw=6.6 \times 10^5$, respectively.

Synthesis Example 6

Synthesis of Copolymer 6

The above-described compound A (13 g, 22 mmol), N,N'-bis(4-bromophenyl)-N,N'-bis(4-t-butyl-2,6-dimethylphen yl)-1,4-phenylenediamine (6.7 g, 9.0 mmol) and 2,2'-bipyridyl (12 g, 75 mmol) were dissolved in 1100 mL of dehydrated tetrahydrofuran, then, an atmosphere in the system was purged with nitrogen by bubbling of nitrogen. Under a nitrogen atmosphere, this solution was reacted up to 60° C. and, bis(1,5-cyclooctadiene)nickel (0) {Ni(COD)$_2$} (21 g, 75 mmol) was added to this at 60° C., and the mixture was reacted for 3 hours while stirring. After the reaction, this reaction solution was cooled down to room temperature (about 25° C.), and dropped into a mixed solution of 25% ammonia water 150 mL/methanol 500 mL/ion exchanged water 500 mL, and the mixture was stirred, then, the deposited precipitate was filtrated and dried under reduced pressure for 2 hours, then, dissolved in 750 mL of toluene before performing filtration, and the filtrate was purified through an aluminum column, and about 750 mL of 4% ammonia water was added to this and the mixture was stirred for 2 hours, then, the aqueous layer was removed. To the organic layer was added about 750 mL of ion exchanged water and the mixture was stirred for 1 hour, then, the aqueous layer was removed.

The organic layer was dropped into about 1500 mL of methanol and the mixture was stirred for 1 hour, and filtrated and dried under reduced pressure for 2 hours. The resultant copolymer (hereinafter, referred to as copolymer 6) revealed a yield of 8.5 g. The polystyrene reduced number average molecular weight and weight average molecular weight were, $Mn=2.0 \times 10^4$ and $Mw=7.7 \times 10^4$, respectively.

Example 1

On a glass substrate carrying thereon an ITO film having a thickness of 150 nm formed by a sputtering method, a solution of poly(ethylenedioxythiophene)/polystyrenesulfonic acid (manufactured by Bayer, BaytronP) was spin-coated to form a film having a thickness of 70 nm, and dried on a hot plate at 200° C. for 10 minutes. Next, a toluene solution so prepared as so contain a 8:2 (weigh ratio) mixture of the copolymer 1 and the copolymer 2 in a concentration of 1.5 wt % was spin-coated at a rotation speed of 1200 rpm to form a film. Further, this was dried under reduced pressure at 90° C. for 1 hour, then, lithium fluoride was vapor-deposited with a thickness of about 4 nm, and as a cathode, calcium was vapor-deposited with a thickness of about 5 nm, then, aluminum was vapor-deposited with a thickness of about 70 nm, to manufacture an EL device. After the degree of vacuum reached $1 \times 10^{-4}$ Pa or less, vapor deposition of a metal was initiated, the resultant device was created, and by applying voltage on this, EL light emission was obtained with a maximum light emission efficiency of 2.4 cd/A. Electric current was allowed to flow through this device, to cause light emission at an initial luminance of 1016 nit, and attenuation of the luminance was checked to find deterioration in luminance down to 60% after 18.4 hours.

Comparative Example 1

A device was created using the copolymer 3 instead of the 8:2 (weight ratio) mixture of the copolymer 1 and the copolymer 2 in Example 1, and by applying voltage on this, EL light emission was obtained with a maximum light emission efficiency of 2.2 cd/A. Electric current was allowed to flow through this device, to cause light emission at an initial luminance of 1011 nit, and attenuation of the luminance was checked to find deterioration in luminance down to 60% after 11.8 hours.

Example 2

The same experiment was carried out as in Example 1 excepting that a polymer in Table 1 was used instead of the 8:2 (weight ratio) mixture of the copolymer 1 and the copolymer 2, to cause light emission with a maximum light emission efficiency and an initial luminance as shown in the table, and attenuation of the luminance was checked.

TABLE 1

| Run | Polymer | Maximum light emission efficiency (cd/A) | Initial luminance (nit) | 60% deterioration time (hr) |
| --- | --- | --- | --- | --- |
| 1 | Copolymer 4/copolymer 6 (80:20) | 2.7 | 2950 | 16.8 |
| 2 | Copolymer 5/copolymer 6 (71:29) | 2.8 | 990 | 91.1 |

Synthesis Example 7

Synthesis of Copolymer 7

The compound A (1.78 g, 3.0 mmol), N,N'-bis(4-bromophenyl)-N,N'-bis(4-t-butyl-2,6-dimethylphen yl)-1,4-phenylenediamine (0.24 g, 0.32 mmol) and 2,2'-bipyridyl (1.39 g, 9.1 mmol) were dissolved in 83 mL of dehydrated tetrahydrofuran, then, an atmosphere in the system was purged with argon by bubbling of argon. The temperature was raised up to 60° C., then, under a nitrogen atmosphere, to this solution was added bis(1,5-cyclooctadiene)nickel (0) {Ni(COD)$_2$} (2.45 g, 9.1 mmol), and the mixture was reacted for 3 hours while stirring. This reaction solution was cooled down to room temperature, and dropped into a mixed solution of 25% ammonia water 12 mL/methanol 83 mL/ion exchanged water 83 mL, and the mixture was stirred for 1 hour, then, the deposited precipitate was filtrated and dried under reduced pressure for 2 hours. Thereafter, the dried product was suspended in 90 g of toluene, and filtration was carried out, subsequently, purification was performed through an aluminum column. Next, 195 mL of 2.9% ammonia water was added, and the mixture was stirred for 2 hours, then, the aqueous layer was removed. Further, to the organic layer was added 195 mL of ion exchanged water and the mixture was stirred for 1 hour, then, the aqueous layer was removed. To the organic layer was added 45 ml of methanol, and decantation was performed and the deposited precipitate was collected, and dissolved in 99 ml of toluene, then, this was dropped into about 300 mL of methanol, and the deposited precipitate was filtrated and dried under reduced pressure for 2 hours. The resultant copolymer (hereinafter, referred to as copolymer 7) revealed a yield of 0.95 g. The polystyrene reduced number average molecular weight and weight average molecular weight were, Mn=$1.8\times10^5$ and Mw=$6.3\times10^5$, respectively.

Synthesis Example 8

Synthesis of Copolymer 8 solution was dropped into 100 mL of methanol and the mixture was stirred for 1 hour, the deposited precipitate was filtrated and dried under reduced pressure for 2 hours. The resultant copolymer (hereinafter, referred to as copolymer 8) revealed a yield of 0.24 g. The polystyrene reduced number average molecular weight was $1.2\times10^5$ and the polystyrene reduced weight average molecular weight was $5.4\times10^5$.

Synthesis Example 9

Synthesis of Copolymer 9

The compound B (10.8 g, 18 mmol), N,N'-bis(4-bromophenyl)-N,N'-bis(4-n-butylphenyl)-1,4-pheny lenediamine (5.1 g, 7.7 mmol) and 2,2'-bipyridyl (11.0 g, 71 mmol) were charged in a reaction vessel, then, an atmosphere in the system was purged with a nitrogen gas. To this was added 800 g of tetrahydrofuran (dehydrated solvent) previously deaerated by bubbling with an argon gas. Next, to this mixed solution was added bis(1,5-cyclooctadiene) nickel (0) (20.0 g, 66 mmol), and the mixture was stirred at room temperature for 10 minutes, then, reacted at 60° C. for 3 hours. The reaction was carried out in a nitrogen gas atmosphere.

After the reaction, this solution was cooled, then, poured into a mixed solution of 25% ammonia water 150 mL/ethanol 500 mL/ion exchanged water 1000 mL, and the mixture was stirred for about 1 hour. Next, the produced precipitate

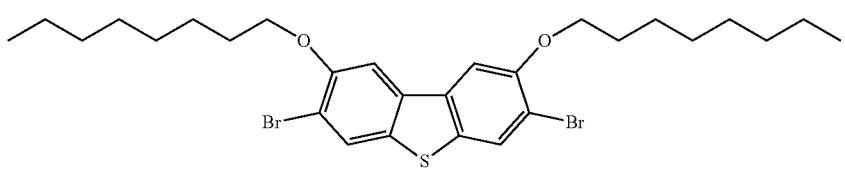

compound B 0.45 g of the above-described compound B (0.75 mmol), 0.012 g of N,N'-bis(4-bromophenyl)-N,N'-bis(4-n-butylphenyl)-1,4-pheny lenediamine (0.018 mmol) and 0.20 g of 2,2'-bipyridyl (1.3 mmol) were charged in a reaction vessel, then, an atmosphere in the system was purged with a nitrogen gas. To this was added 20 ml of tetrahydrofuran (dehydrated solvent) previously deaerated by bubbling with an argon gas. Next, to this mixed solution was added 0.36 g (1.3 mmol) of bis(1,5-cyclooctadiene)nickel (0), the mixture was reacted at 60° C. for 3 hours. The reaction was carried out in a nitrogen gas atmosphere. After the reaction, this solution was cooled, then, poured into a mixed solution of 25% ammonia water 10 mL/methanol 120 mL/ion exchanged water 50 mL, and the mixture was stirred for about 1 hour. Next, the produced precipitate was recovered by filtration. This precipitate was washed with ethanol, then, dried under reduced pressured for 2 hours. Next, this precipitate was dissolved in 30 mL of toluene, and 30 mL of 1 N hydrochloric acid was added to this and the mixture was stirred for 1 hour, the aqueous layer was removed and to the organic layer was added 30 mL of 4% ammonia water and the mixture was stirred for 1 hour, then, the aqueous layer was removed. The organic layer was dropped into 150 mL of methanol and the mixture was stirred for 1 hour, the deposited precipitate was filtrated and dried under reduced pressure for 2 hours, and dissolved in 30 mL of toluene. Thereafter, purification was performed through an alumina column (alumina amount: 20 g), and the recovered toluene was filtrated and recovered. This precipitate was dried under reduced pressured, then, dissolved in toluene. This solution was filtrated to remove insoluble materials, then, this toluene solution was washed with 1 N hydrochloric acid, then, partitioned, and the toluene solution was recovered. Next, this toluene solution was washed with ca. 3% ammonia water, then, partitioned and the toluene solution was recovered. Next, this toluene solution was washed with ion exchanged water, then, partitioned and the toluene solution was recovered. Next, this toluene solution was passed through a column filled with alumina to perform purification. Next, to this toluene solution was added methanol under stirring, to cause re-precipitation purification.

Next, the produced precipitate was recovered, and this precipitate was died under reduced pressure to obtain 6.0 g of a polymer. This polymer is called polymer compound. The resultant polymer compound had a polystyrene reduced weight average molecular weight of $1.1\times10^5$ and a polystyrene reduced number average molecular weight of $2.1\times10^4$.

Synthesis Example 10

Synthesis of Copolymer 10

0.50 g (0.84 mmol) of the compound B, 0.063 g (0.093 mmol) of N,N'-bis(4-bromophenyl)-N,N'-bis(4-n-butylphenyl)-1,4-pheny lenediamine and 0.30 g (1.9 mmol) of 2,2'-bipyridyl were charged in a reaction vessel, then, an atmosphere in the system was purged with a nitrogen gas. To this was added 20 ml of tetrahydrofuran (dehydrated solvent) previously deaerated by bubbling with an argon gas. Next, to this mixed solution was added 0.54 g (1.9 mmol) of bis(1,5-cyclooctadiene)nickel (0), and the mixture was reacted at 60° C. for 3 hours. The reaction was carried out in a nitrogen gas atmosphere. After the reaction, this solution was cooled, then, poured into a mixed solution of 25% ammonia water 10 mL/methanol 120 mL/ion exchanged water 50 mL, and the mixture was stirred for about 1 hour. Next, the produced precipitate was recovered by filtration. This precipitate was washed with ethanol, then, dried under reduced pressured for 2 hours. Then, this precipitated was dissolved in 30 mL of toluene, and 30 mL of 1 N hydrochloric acid was added to this and the mixture was stirred for 1 hour, the aqueous layer was removed and to the organic layer was added 30 mL of 4% ammonia water and the mixture was stirred for 1 hour, then, the aqueous layer was removed. The organic layer was dropped into 150 mL of methanol and the mixture was stirred for 1 hour, the deposited precipitate was filtrated and dried under reduced pressure for 2 hours, and dissolved in 30 mL of toluene. Thereafter, purification was performed through an alumina column (alumina amount: 20 g), and the recovered toluene solution was dropped into 100 mL of methanol and the mixture was stirred for 1 hour, the deposited precipitate was filtrated and dried under reduced pressure for 2 hours. The resultant copolymer 10 revealed a yield of 0.16 g.

The copolymer 10 had a polystyrene reduced number average molecular weight of $8.1 \times 10^4$ and a polystyrene reduced weight average molecular weight of $1.4 \times 10^5$.

Synthesis Example 11

Synthesis of Copolymer 11 was removed and to the organic layer was added 50 mL of 4% ammonia water and the mixture was stirred for 1 hour, then, the aqueous layer was removed. The organic layer was dropped into 120 mL of methanol and the mixture was stirred for 1 hour, the deposited precipitate was filtrated and dried under reduced pressure for 2 hours, and dissolved in 30 mL of toluene. Thereafter, purification was performed through an alumina column (alumina amount: 20 g), and the recovered toluene solution was dropped into 100 mL of methanol and the mixture was stirred for 1 hour, the deposited precipitate was filtrated and dried under reduced pressure for 2 hours. The resultant copolymer 11 revealed a yield of 0.24 g.

The copolymer 11 had a polystyrene reduced number average molecular weight of $7.3 \times 10^4$ and a polystyrene reduced weight average molecular weight of $2.7 \times 10^5$.

Synthesis Example 12

Synthesis of Copolymer 12

The compound C (6.12 g, 11 mmol), N,N'-bis(4-bromophenyl)-N,N'-bis(4-t-butyl-2,6-dimethylphen yl)-1,4-phenylenediamine (3.32 g, 4.5 mmol) and 2,2'-bipyridyl (6.42 g, 41 mmol) were charged in a reaction vessel, then, an atmosphere in the system was purged with a nitrogen gas. To this was added 400 g of tetrahydrofuran (dehydrated solvent) previously deaerated by bubbling with an argon gas. Next, to this mixed solution was added bis(1,5-cyclooctadiene)nickel (0) (11.7 g, 38 mmol), and the mixture was stirred at room temperature for 10 minutes, then, reacted at 60° C. for 3 hours. The reaction was carried out in a nitrogen gas atmosphere.

After the reaction, this solution was cooled, then, poured into a mixed solution of 25% ammonia water 50 mL/methanol 200 mL/ion exchanged water 200 mL, and the mixture

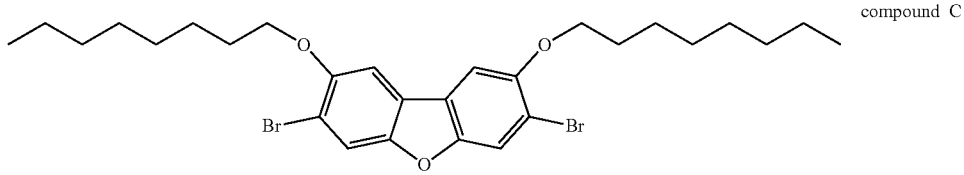 [SMILES: CCCCCCCCOc1cc2c(cc1Br)oc1cc(Br)c(OCCCCCCCC)cc12]

compound C 0.60 g (1.0 mmol) of the above-described compound C, 0.040 g (0.054 mmol) of N,N'-bis(4-bromophenyl)-N,N'-bis(4-t-butyl-2,6-dimethylphen yl)-1,4-phenylenediamine and 0.47 g (3.0 mmol) of 2,2'-bipyridyl were charged in a reaction vessel, then, an atmosphere in the system was purged with a nitrogen gas. To this was added 30 ml of tetrahydrofuran (dehydrated solvent) previously deaerated by bubbling with an argon gas. Next, to this mixed solution was added 0.84 g (3.0 mmol) of bis(1,5-cyclooctadiene) nickel (0), and the mixture was reacted at 60° C. for 3 hours. The reaction was carried out in a nitrogen gas atmosphere. After the reaction, this solution was cooled, then, poured into a mixed solution of 25% ammonia water 10 mL/methanol 120 mL/ion exchanged water 50 mL, and the mixture was stirred for about 1 hour. Next, the produced precipitate was recovered by filtration. This precipitate was washed with ethanol, then, dried under reduced pressured for 2 hours. Then, this precipitated was dissolved in 50 mL of toluene, and 50 mL of 1 N hydrochloric acid was added to this and the mixture was stirred for 1 hour, the aqueous layer was stirred for about 1 hour. Next, the produced precipitate was filtrated and recovered. This precipitate was dried under reduced pressure, then, dissolved in toluene. This solution was filtrated to remove insoluble materials, then, this toluene solution was passed through a column filled with alumina to perform purification. Next, this toluene solution was washed with 1N hydrochloric acid, then, partitioned, and the toluene solution was recovered. Then, this toluene solution was washed with ca. 3% ammonia water, then, partitioned and the toluene solution was recovered. Next, this toluene solution was washed with ion exchanged water, then, partitioned and the toluene solution was recovered. Next, this toluene solution was poured into methanol, to cause re-precipitation purification.

Next, the produced precipitate was filtrated and recovered. This precipitate was died under reduced pressure. The resultant polymer compound 12 revealed a yield of 4.5 g. The polymer compound 12 had a polystyrene reduced weight average molecular weight of $7.6 \times 10^4$ and a polystyrene reduced number average molecular weight of $2.8 \times 10^4$.

Synthesis Example 13

Synthesis of Copolymer 13

0.60 g (1.0 mmol) of the compound C, 0.080 g (0.11 mmol) of N,N'-bis(4-bromophenyl)-N,N'-bis(4-t-butyl-2,6-dimethylphen yl)-1,4-phenylenediamine and 0.50 g (3.2 mmol) of 2,2'-bipyridyl were charged in a reaction vessel, then, an atmosphere in the system was purged with a nitrogen gas. To this was added 32 ml of tetrahydrofuran (dehydrated solvent) previously deaerated by bubbling with an argon gas. Next, to this mixed solution was added 0.85 g (3.2 mmol) of bis(1,5-cyclooctadiene)nickel (0), and the mixture was reacted at 60° C. for 3 hours. The reaction was carried out in a nitrogen gas atmosphere. After the reaction, this solution was cooled, then, poured into a mixed solution of 25% ammonia water 10 mL/methanol 120 mL/ion exchanged water 50 mL, and the mixture was stirred for about 1 hour. Next, the produced precipitate was recovered by filtration. This precipitate was washed with ethanol, then, dried under reduced pressure for 2 hours. Then, this precipitate was dissolved in 50 mL of toluene, and 50 mL of 1 N hydrochloric acid was added to this and the mixture was stirred for 1 hour, the aqueous layer was removed and to the organic layer was added 50 mL of 4% ammonia water and the mixture was stirred for 1 hour, then, the aqueous layer was removed. The organic layer was dropped into 120 mL of methanol and the mixture was stirred for 1 hour, the deposited precipitate was filtrated and dried under reduced pressure for 2 hours, and dissolved in 30 mL of toluene. Thereafter, purification was performed through an alumina column (alumina amount: 20 g), and the recovered toluene solution was dropped into 100 mL of methanol and the mixture was stirred for 1 hour, the deposited precipitate was filtrated and dried under reduced pressure for 2 hours. The resultant copolymer 13 revealed a yield of 0.25 g.

The copolymer 13 had a polystyrene reduced number average molecular weight of $4.6 \times 10^4$ and a polystyrene reduced weight average molecular weight of $2.2 \times 10^5$.

Comparative Example 2

A device was created using the copolymer 7 (F018-A061=9-1) instead of the 8:2 (weight ratio) mixture of the copolymer 4 and the copolymer 6 in Example 2, and by applying voltage on this, EL light emission was obtained with a maximum light emission efficiency of 2.6 cd/A. Electric current was allowed to flow through this device, to cause light emission at an initial luminance of 2900 nit, and attenuation of the luminance was checked to find deterioration in luminance down to 60% after 7.8 hours.

Example 3

A device was created using a 71:29 (weight ratio) mixture of the copolymer 8 and the copolymer 9 instead of the 8:2 (weight ratio) mixture of the copolymer 1 and the copolymer 2 in Example 1, and by applying voltage on this, EL light emission was obtained with a maximum light emission efficiency of 2.7 cd/A. Electric current was allowed to flow through this device, to cause light emission at an initial luminance of 100 nit, and attenuation of the luminance was checked to find deterioration in luminance down to 60% after 4.3 hours.

Comparative Example 3

A device was created using the copolymer 10 instead of the 71:29 (weight ratio) mixture of the copolymer 8 and the copolymer 9 in Example 3, and by applying voltage on this, EL light emission was obtained with a maximum light emission efficiency of 2.8 cd/A. Electric current was allowed to flow through this device, to cause light emission at an initial luminance of 98 nit, and attenuation of the luminance was checked to find deterioration in luminance down to 60% after 1.2 hours.

Example 4

A device was created using a 80:20 (weight ratio) mixture of the copolymer 11 and the copolymer 12 instead of the 8:2 (weight ratio) mixture of the copolymer 1 and the copolymer 2 in Example 1, and by applying voltage on this, EL light emission was obtained with a maximum light emission efficiency of 3.4 cd/A. Electric current was allowed to flow through this device, to cause light emission at an initial luminance of 102 nit, and attenuation of the luminance was checked to find deterioration in luminance down to 60% after 5.8 hours.

Comparative Example 4

A device was created using the copolymer 13 instead of the 80:20 (weight ratio) mixture of the copolymer 11 and the copolymer 12 in Example 4, and by applying voltage on this, EL light emission was obtained with a maximum light emission efficiency of 3.2 cd/A. Electric current was allowed to flow through this device, to cause light emission at an initial luminance of 100 nit, and attenuation of the luminance was checked to find deterioration in luminance down to 60% after 1.6 hours.

INDUSTRIAL APPLICABILITY

The polymer composition of the present invention provides a light emitting device having high performances such as high light emission efficiency, longer life and the like when used as a light emitting material of the light emitting device.

The invention claimed is:

1. A polymer composition comprising:
the polymer composition comprising 1 to 99 wt % of the following copolymer (A) and 99 to 1 wt % of the following copolymer (B):
Copolymer (A): a copolymer showing fluorescence in the solid state and having a polystyrene-reduced number average molecular weight of $10^3$ to $10^8$, and containing a repeating unit (a) and a repeating unit (b), and said copolymer has a relation of $100 > X_{aA} > 5$, provided that $X_{aA}$ (%) is a percentage of the mol number of the repeating unit (a) based on the sum of the mol numbers of the repeating units (a) and (b), and
Copolymer (B): a copolymer showing fluorescence in the solid state and having a polystyrene-reduced number average molecular weight of $10^3$ to $10^8$, and containing (a) a repeating unit and (b) a repeating unit, and said copolymer satisfies a relation of $X_{aB} \leq X_{aA} - 5$, provided that $X_{aB}$ (%) is a percentage of the mol number of the repeating unit (a) based on the sum of the mol numbers of the repeating units (a) and (b);
wherein the repeating unit (b) in each Copolymer (A) and Copolymer (B) is a repeating unit represented by the following formula (2):

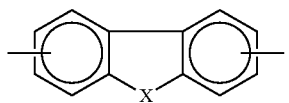

wherein, X represents $-CR_3R_4-$, $R_3$ and $R_4$ represent each independently an alkyl group or an aryl group with the proviso that at least one of $R_3$ and $R_4$ represents a phenyl group; when $R_3$ and $R_4$ are groups having an alkyl, the alkyl may be interrupted by a group containing a hetero atom, and the repeating unit (a) in each Copolymer (A) and Copolymer (B) is a repeating unit represented by the following formula (1):

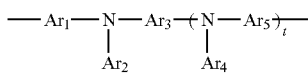

wherein, $Ar_1$, $Ar_3$ and $Ar_5$ represent each independently an arylene group, $Ar_2$ and $Ar_4$ represent each independently an aryl and t represents an integer of 0 to 1 and when there are a plurality of $Ar_4$s and $Ar_5$s, respectively, they may be the same or different.

2. The polymer composition according to claim 1, wherein $R_3$ and $R_4$ represent each independently an aryl group.

3. The polymer composition according to claim 1, wherein the repeating unit (a) has a hole injection property or a hole transportation property.

4. The polymer composition according to claim 1, wherein the composition comprises 5 to 95 wt % of the copolymer (A) and 95 to 5 wt % of the copolymer (B).

5. An ink composition comprising the polymer composition as described in claim 1.

6. A polymer light emitting device having a light emitting layer between electrodes composed an anode and a cathode wherein the light emitting layer contains the polymer composition as described in claim 1.

7. A sheet light source comprising the polymer light emitting device as described in claim 6.

8. A segment display comprising the polymer light emitting device as described in claim 6.

9. A dot matrix display comprising the polymer light emitting device as described in claim 6.

* * * * *